United States Patent
Akutsu

(10) Patent No.: US 9,818,753 B2
(45) Date of Patent: Nov. 14, 2017

(54) SEMICONDUCTOR MEMORY DEVICE AND METHOD FOR MANUFACTURING THE SAME

(71) Applicant: Toshiba Memory Corporation, Minato-ku (JP)

(72) Inventor: Yoshihiro Akutsu, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/063,859

(22) Filed: Mar. 8, 2016

(65) Prior Publication Data
US 2017/0110462 A1 Apr. 20, 2017

Related U.S. Application Data

(60) Provisional application No. 62/243,871, filed on Oct. 20, 2015.

(51) Int. Cl.
| | |
|---|---|
| *H01L 29/76* | (2006.01) |
| *H01L 27/115* | (2017.01) |
| *H01L 23/522* | (2006.01) |
| *H01L 23/528* | (2006.01) |

(52) U.S. Cl.
CPC .......... *H01L 27/115* (2013.01); *H01L 23/528* (2013.01); *H01L 23/5226* (2013.01)

(58) Field of Classification Search
CPC ......... H01L 27/11556; H01L 27/11529; H01L 27/11548; H01L 27/11575; H01L 27/11582; H01L 29/7926; H01L 29/66833

USPC .......................................................... 357/314
See application file for complete search history.

(56) References Cited

U.S. PATENT DOCUMENTS

| | | | |
|---|---|---|---|
| 8,426,908 B2 | 4/2013 | Higashi | |
| 2010/0133599 A1* | 6/2010 | Chae ................. | H01L 27/11578 257/315 |
| 2013/0032874 A1 | 2/2013 | Ko | |
| 2013/0154055 A1* | 6/2013 | Park .................... | H01L 27/0805 257/532 |
| 2013/0234332 A1 | 9/2013 | Iino et al. | |
| 2016/0148946 A1* | 5/2016 | Hironaga .......... | H01L 27/11556 257/324 |

* cited by examiner

*Primary Examiner* — Trung Q Dang
(74) *Attorney, Agent, or Firm* — Oblon, McClelland, Maier & Neustadt, L.L.P.

(57) ABSTRACT

In general, according to one embodiment, a semiconductor memory device includes a first conductive layer, a second conductive layer, a first sub-conductive layer, a first insulating film. One portion of the first conductive layer overlaps at least one portion of the first sub-conductive layer in the first direction. One other portion of the first conductive layer overlaps at least one portion of the second conductive layer in the first direction. One portion of the first insulating film overlaps at least one portion of the second conductive layer in the second direction. The One portion of the first insulating film overlaps one portion of the first sub-conductive layer in the second direction. The second conductive layer overlap one other portion of the first insulating film in a direction intersecting the second direction.

19 Claims, 30 Drawing Sheets

SEMICONDUCTOR MEMORY DEVICE AND METHOD FOR MANUFACTURING THE SAME

CROSS-REFERENCE TO RELATED APPLICATIONS

This application is based upon and claims the benefit of priority from U.S. Provisional Patent Application 62/243,871, filed on Oct. 20, 2015; the entire contents of which are incorporated herein by reference.

FIELD

Embodiments described herein relate generally to a semiconductor memory device and a method for manufacturing the same.

BACKGROUND

A memory device having a three-dimensional structure has been proposed in which memory cells are arranged three-dimensionally. It is desirable to improve the productivity of such a semiconductor memory device.

DETAILED DESCRIPTION

Figure 1A:
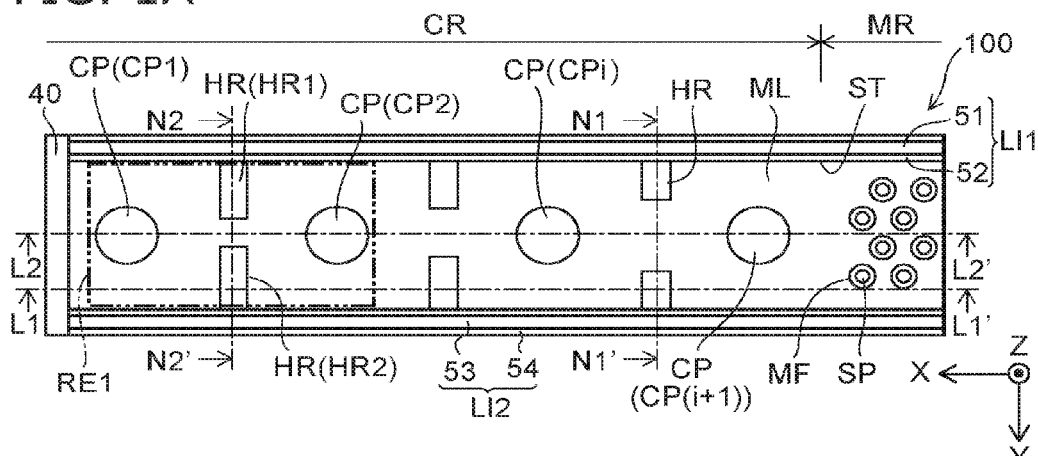
FIG. 1A to FIG. 1C are schematic views showing a semiconductor memory device according to a first embodiment.

In general, according to one embodiment, a semiconductor memory device includes a first conductive layer, a second conductive layer, a first sub-conductive layer, a first insulating film. The second conductive layer is provided to be separated from the first conductive layer in a first direction. The first sub-conductive layer is provided to be separated from the second conductive layer in a second direction intersecting the first direction. The first insulating film is provided between the second conductive layer and the first sub-conductive layer. One portion of the first conductive layer overlaps at least one portion of the first sub-conductive layer in the first direction. One other portion of the first conductive layer overlaps at least one portion of the second conductive layer in the first direction. One portion of the first insulating film overlaps at least one portion of the second conductive layer in the second direction. The One portion of the first insulating film overlaps one portion of the first sub-conductive layer in the second direction. The second conductive layer overlaps one other portion of the first insulating film in a direction intersecting the second direction.

Embodiment of the invention will be described hereinafter with reference to the accompanying drawings.

The drawings are schematic and conceptual, and the relationships between the thickness and width of portions, the size ratio among portions, etc., are not necessarily the same as the actual values thereof. Further, the dimensions and proportions may be illustrated differently among drawings, even for identical portions. In the present specification and drawings, the same elements as those described previously with reference to earlier figures are labeled with like reference numerals, and the detailed description thereof is omitted as appropriate.

A first embodiment will now be described.

Figure 1B:
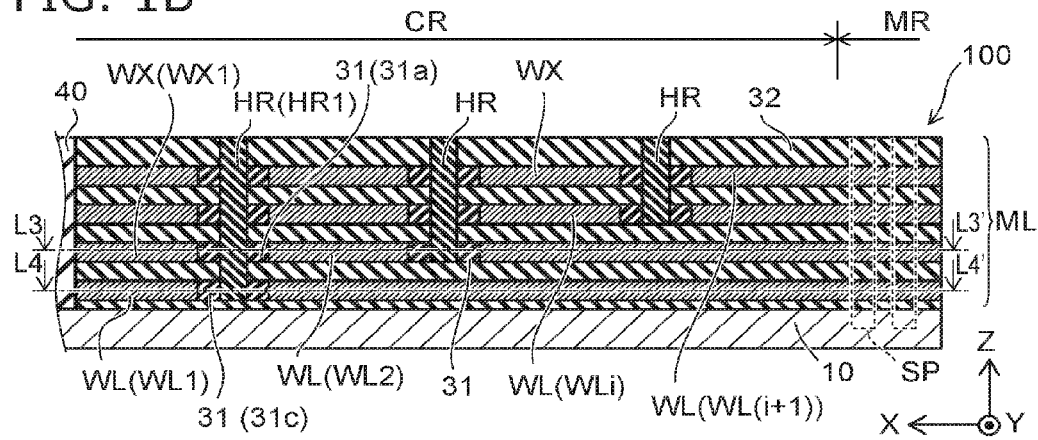
Figure 1C:
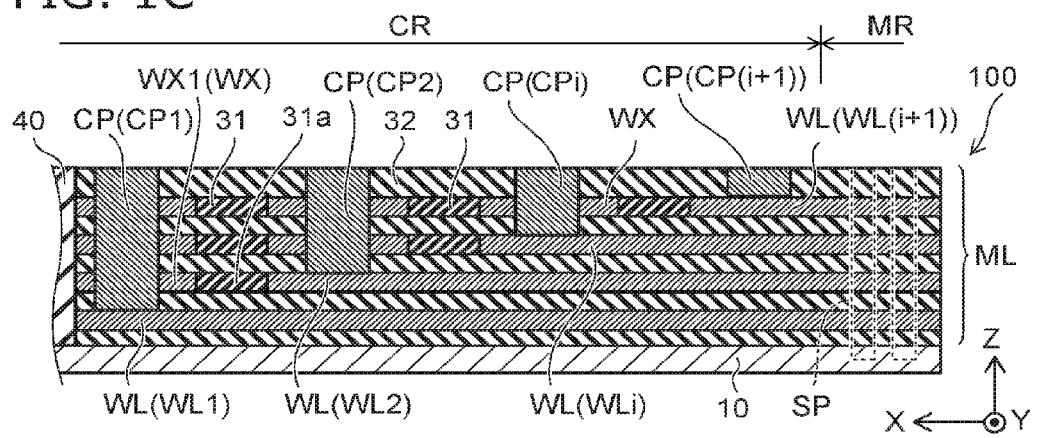

FIG. 1A to FIG. 1C are schematic views showing a semiconductor memory device according to the embodiment.

Figure 2A:
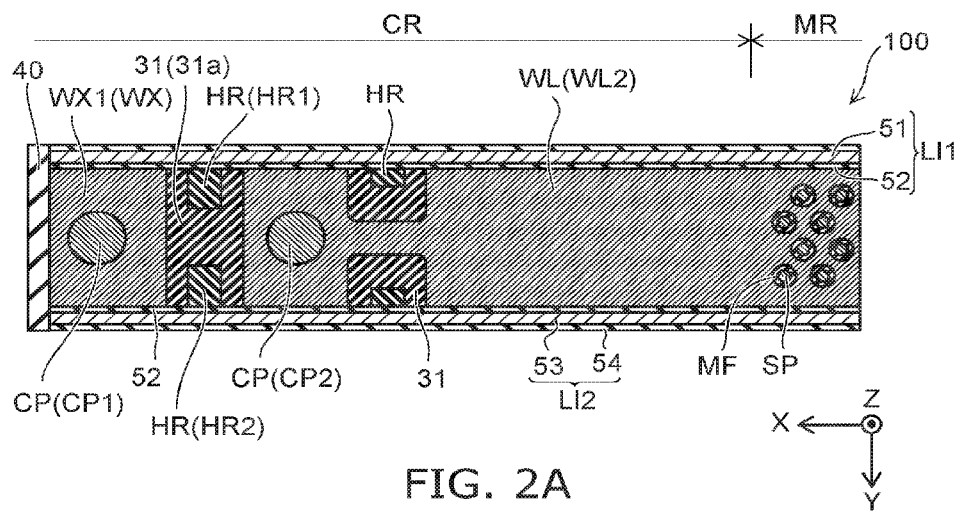
FIG. 2A and FIG. 2B are cross-sectional views showing the semiconductor memory device according to the first embodiment.
Figure 2B:
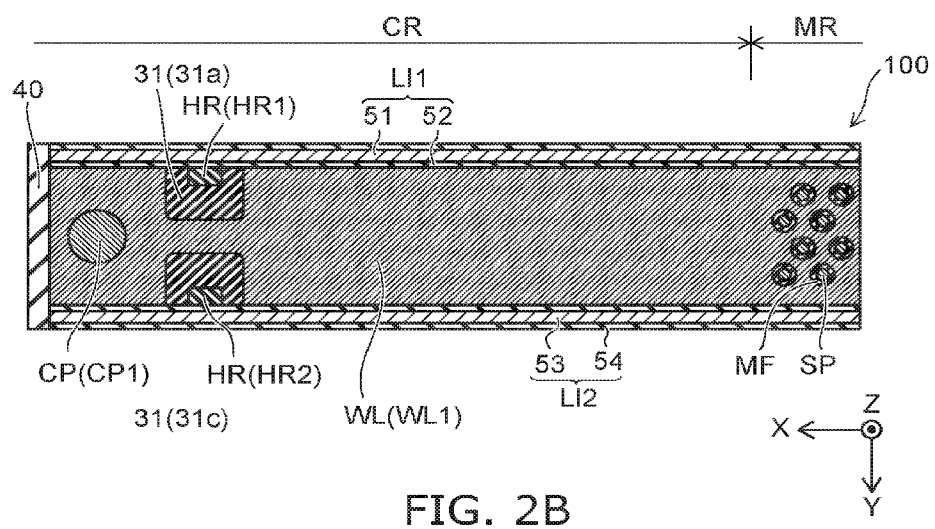

FIG. 2A and FIG. 2B are cross-sectional views showing the semiconductor memory device according to the embodiment.

FIG. 1A is a plan view showing the semiconductor memory device according to the embodiment. FIG. 1B is a cross-sectional view showing a cross section along line L1-L1' shown in FIG. 1. FIG. 1C is a cross-sectional view showing a cross section along line L2-L2' shown in FIG. 1. FIG. 2A is a cross-sectional view showing a cross section along line L3-L3' shown in FIG. 1B. FIG. 2B is a cross-sectional view showing a cross section along line L4-L4' shown in FIG. 1B.

As shown in FIG. 1A, a foundation layer 10 is provided in the semiconductor memory device 100 according to the embodiment. The foundation layer 10 is, for example, a semiconductor substrate. A connection region CR and a memory region MR are set in the semiconductor memory device 100. The foundation layer 10 includes a portion inside the connection region CR and a portion inside the memory region MR.

A stacked body ML is provided in the semiconductor memory device 100. The stacked body ML is provided in the memory region MR and the connection region CR on the semiconductor substrate 10.

As shown in FIG. 1A and FIG. 1B, multiple semiconductor pillars SP are provided in the memory region MR. The multiple semiconductor pillars SP extend through the stacked body ML.

The direction in which the semiconductor pillars SP extend is taken as a Z-direction. One direction orthogonal to the Z-direction is taken as an X-direction. A direction orthogonal to the Z-direction and the X-direction is taken as a Y-direction. In the example, for example, the memory region MR is arranged with the connection region CR in the X-direction.

The multiple semiconductor pillars SP extend in the Z-direction through the stacked body ML. For example, the semiconductor pillars SP have substantially circular columnar configurations. For example, the semiconductor pillars SP are electrically connected to the foundation layer 10.

As shown in FIG. 1A, a memory film MF is provided between the semiconductor pillar SP and the stacked body ML. For example, the memory film MF has a tubular configuration. Examples of the semiconductor pillar SP and the memory film MF are described below.

As shown in FIG. 1B, the stacked body ML includes multiple conductive layers WL. For example, the multiple conductive layers WL are provided to be separated in the Z-direction. For example, insulators such as inter-electrode insulating layers 32, etc., are provided between the multiple conductive layers WL in the Z-direction.

On the other hand, multiple insulating films HR and multiple insulating layers 31 are provided in the connection region CR. The multiple insulating films HR are provided to be separated from each other. As shown in FIG. 1B, for example, the multiple insulating films HR extend in the Z-direction through the stacked body ML. For example, the insulating layer 31 is provided between the insulating film HR and the conductive layer WL in the X-direction.

As shown in FIG. 1C, multiple contact plugs CP are provided in the connection region CR. The contact plugs CP extend in the Z-direction through the stacked body ML. For example, the contact plugs CP have substantially circular columnar configurations. The multiple contact plugs CP include, for example, a first contact plug CP1, a second contact plug CP2, an ith contact plug CPi, a (i+1)th contact plug CP(i+1), etc. In the embodiment, i is an integer not less than 3.

The multiple conductive layers WL include, for example, a first conductive layer WL1, a second conductive layer WL2, an ith conductive layer WLi, and a (i+1)th conductive layer WL(i+1). The multiple conductive layers WL further include, for example, multiple sub-conductive layers WX.

The first conductive layer WL1, the second conductive layer WL2, the ith conductive layer WLi, and the (i+1)th conductive layer WL(i+1) are disposed to be separated from each other in the Z-direction. The first conductive layer WL1, the second conductive layer WL2, the ith conductive layer WLi, and the (i+1)th conductive layer WL(i+1) are disposed in this order along the Z-direction. Each of the first conductive layer WL1, the second conductive layer WL2, the ith conductive layer WLi, and the (i+1)th conductive layer WL(i+1) is provided to be continuous from the memory region MR.

The memory film MF is disposed between the first conductive layer WL1 and the semiconductor pillar SP, between the second conductive layer WL2 and the semiconductor pillar SP, between the ith conductive layer WLi and the semiconductor pillar SP, and between the (i+1)th conductive layer WL(i+1) and the semiconductor pillar SP.

The multiple sub-conductive layers WX are disposed in the connection region CR. The multiple sub-conductive layers WX are disposed to be separated from the first conductive layer WL1, the second conductive layer WL2, the ith conductive layer WLi, and the (i+1)th conductive layer WL(i+1).

The multiple sub-conductive layers WX include, for example, a first sub-conductive layer WX1. As shown in FIG. 2A, the first sub-conductive layer WX1 is disposed to be separated from the second conductive layer WL2 in the X-direction. The second contact plug CP2 is electrically connected to the second conductive layer WL2. The first contact plug CP1 is electrically connected to the first sub-conductive layer WX1.

In the X-direction, a first insulating film HR1, a second insulating film HR2, and a first insulating layer 31a are provided between the second conductive layer WL2 and the first sub-conductive layer WX1. The first insulating film HR1 and the second insulating film HR2 are included in the multiple insulating films HR described above. The first insulating layer 31a is included in the multiple insulating layers 31 described above. For example, the second conductive layer WL2 and the first sub-conductive layer WX1 are electrically isolated by the first insulating film HR1, the second insulating film HR2, and the first insulating layer 31a.

As shown in FIG. 2B, the first conductive layer WL1 is electrically connected to the first contact plug CP1. In such a case, as shown in FIG. 1C, the first contact plug CP1 passes through the first sub-conductive layer WX1 and is electrically connected to the first conductive layer WL1. Similarly, the second contact plug CP2 and the ith contact plug CPi also are electrically connected via the sub-conductive layers WX to one of the multiple conductive layers WL provided to be continuous from the memory region MR.

The insulating films HR, the insulating layers 31, and the conductive layers WL will now be described using the configuration of a region RE1 shown in FIG. 1A as an example.

Figure 3:
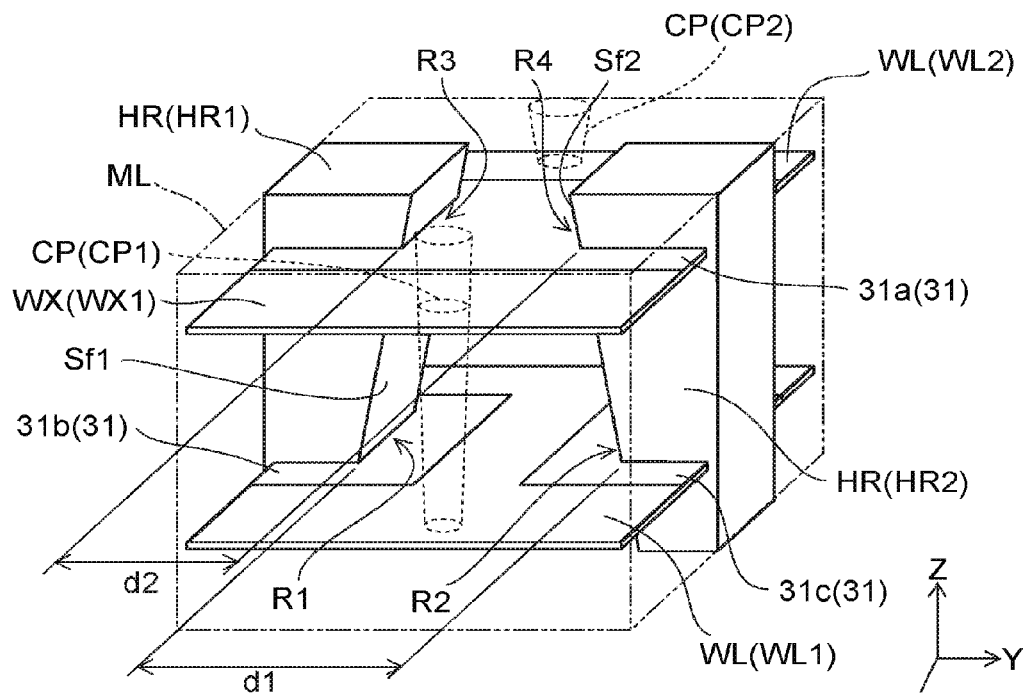
FIG. 3 is a schematic perspective view showing one portion of the semiconductor memory device according to the first embodiment.

FIG. 3 is a schematic perspective view showing one portion of the semiconductor memory device according to the embodiment.

Figure 4:
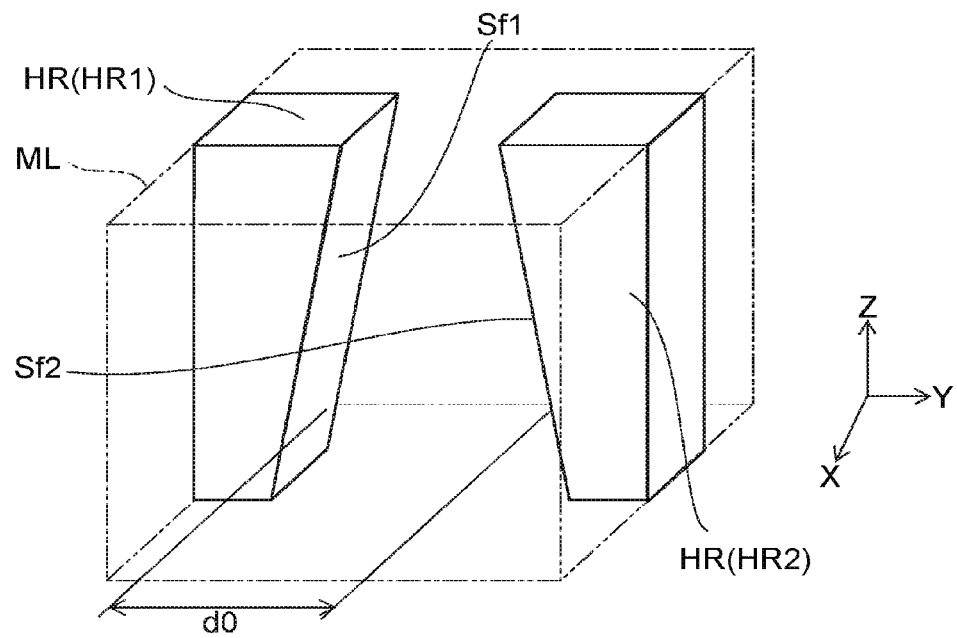
FIG. 4 is a schematic perspective view showing the one portion of the semiconductor memory device according to the first embodiment.

FIG. 4 is a schematic perspective view showing the one portion of the semiconductor memory device according to the embodiment.

Figure 5:
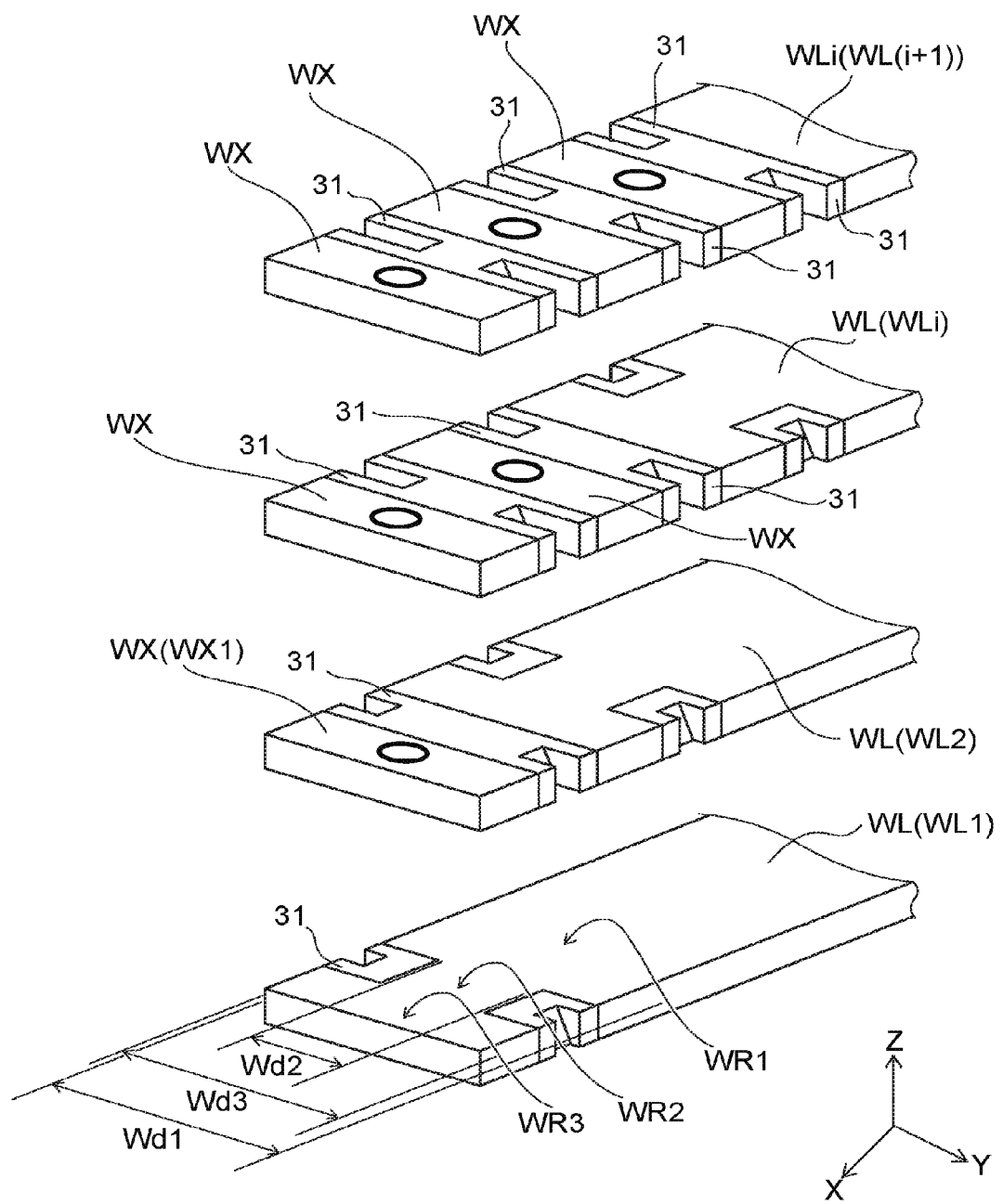
FIG. 5 is a schematic perspective view showing the conductive layers of the semiconductor memory device according to the first embodiment.

FIG. 5 is a schematic perspective view showing the conductive layers of the semiconductor memory device according to the embodiment.

FIG. 3 and FIG. 4 are perspective views showing one portion of the semiconductor memory device of the region RE1 shown in FIG. 1. FIG. 5 is a perspective view showing the configurations of the conductive layers in the connection region.

In FIG. 3, the components other than the first insulating film HR1, the second insulating film HR2, the stacked body ML, the first conductive layer WL1, the first sub-conductive layer WX1, the second conductive layer WL2, the first to third insulating layers 31a to 31c, the first contact plug CP1, and the second contact plug CP2 are not shown for easier viewing of the drawing. Also, the distances between the layers in the Z-direction are shown as being elongated. The components other than the stacked body ML, the first insulating film HR1, and the second insulating film HR2 are not shown in FIG. 4. The components other than the conductive layers WL and the insulating layers 31 are not shown in FIG. 5. The distances between the layers in the Z-direction are shown as being elongated in FIG. 5.

As shown in FIG. 3, the first conductive layer WL1 and the second conductive layer WL2 are disposed to be separated from each other in the Z-direction. The first conductive layer WL1 and the first sub-conductive layer WX1 are disposed to be separated from each other in the Z-direction. The second conductive layer WL2 and the first sub-conductive layer WX1 are arranged in the X-direction.

As described above, for example, the first insulating film HR1, the second insulating film HR2, and the first insulating layer 31a are disposed between the second conductive layer WL2 and the first sub-conductive layer WX1. The first insulating film HR1 and the second insulating film HR2 are provided to be separated from each other. For example, the first insulating film HR1 and the second insulating film HR2 are arranged in the Y-direction.

One portion of the first insulating layer 31a is positioned between one portion of the first insulating film HR1 and one portion of the second insulating film HR2 in the Y-direction. The first insulating layer 31a overlaps the one portion of the first insulating film HR1 in the Y-direction; and the first insulating layer 31a overlaps the one portion of the second insulating film HR2 in the Y-direction.

In the Y-direction, one portion of the first conductive layer WL1 is disposed between one other portion of the first insulating film HR1 and one other portion of the second insulating film HR2. The second insulating layer 31b is provided between the first conductive layer WL1 and the one other portion of the first insulating film HR1. The third insulating layer 31c is provided between the first conductive layer WL1 and the one other portion of the second insulating film HR2. For example, the second insulating layer 31b and the third insulating layer 31c are included in the multiple insulating layers 31 described above.

In the stacked body ML as shown in FIG. 1C, the conductive layers WL that extend to be continuous from the memory region MR are electrically isolated from the sub-conductive layers WX by the insulating layers 31, etc. The position of the end portion of the conductive layer WL extending to be continuous from the memory region MR is more proximal to the memory region MR toward the upper layer of the stacked body ML. In other words, the end portions of the conductive layers WL extending to be continuous from the memory region MR are disposed in a stairstep configuration.

For example, the ith contact plug CPi is provided on the ith conductive layer WLi, passes through the sub-conductive layer WX overlapping one portion of the ith conductive layer WLi in the Z-direction, and is electrically connected to the ith conductive layer WLi. Accordingly, the ith contact plug CPi is not electrically connected to the (i+1)th conductive layer WL(i+1) overlapping one other portion of the ith conductive layer in the Z-direction.

That is, one contact plug CP is electrically connected to one of the conductive layers WL extending to be continuous from the memory region MR and passes through the sub-conductive layer WX provided on the conductive layer WL. Thereby, a prescribed contact plug CP is electrically connected to a prescribed one of the conductive layers WL extending to be continuous from the memory region MR.

However, the contact plug CP that is connected to the conductive layer WL of the conductive layers WL extending to be continuous from the memory region MR most distal to the foundation layer 10 (e.g., a semiconductor substrate) does not pass through the sub-conductive layer WX.

There is a reference example in which the connection portions of the multiple conductive layers WL to the contact plugs CP have a stairstep configuration. In the reference example, for example, stepped portions are formed by repeating etching using a mask and slimming of the mask. In such a case, lithography processes are performed many times according to the number of stepped portions. Accordingly, the manufacturing processes increase as the number of layers of the stacked body ML increases.

On the other hand, in the semiconductor memory device 100 according to the embodiment, the insulating films HR and the insulating layers 31 are provided. The conductive layer WL that is electrically connected to the contact plug CP is determined by the sizes and configurations of the insulating layers 31 and the insulating films HR. Thereby, one of the conductive layers WL provided to be continuous from the prescribed memory region MR can be electrically connected to the contact plug CP without patterning the stacked body ML into a stairstep configuration. Accordingly, the processes of forming the stepped portions in the stacked body ML can be reduced.

As shown in FIG. 4, the first insulating film HR1 has a first surface Sf1 intersecting the X-Y plane. The second insulating film HR2 has a second surface Sf2 intersecting the X-Y plane. For example, the first surface Sf1 opposes the second surface Sf2. A length d0 between the first surface Sf1 and the second surface Sf2 in the Y-direction becomes shorter toward the Z-direction.

For example, as shown in FIG. 3, the first surface Sf1 of the first insulating film HR1 includes a first region R1 that overlaps the one portion of the first conductive layer WL1 in the Y-direction. The second surface Sf2 of the second insulating film HR2 includes a second region R2 that overlaps the one portion of the first conductive layer WL1 in the Y-direction.

The first surface Sf1 includes a third region R3 that overlaps the one portion of the first insulating layer 31a in the Y-direction. The second surface Sf2 includes a fourth region R4 that overlaps the one portion of the first insulating layer 31a in the Y-direction.

A length d1 between the first region R1 and the second region R2 is longer than a length d2 between the third region R3 and the fourth region R4.

As shown in FIG. 5, for example, the first conductive layer WL1 includes a first conductive layer overlap region WR1, a first intermediate region WR2, and a first sub-conductive layer overlap region WR3. The second conductive layer WL2 overlaps the first conductive layer overlap region WR1 in the Z-direction. The first intermediate region WR2 overlaps a region between the first sub-conductive layer WX1 and the second conductive layer WL2 in the Z-direction. The first sub-conductive layer overlap region WR3 overlaps the first sub-conductive layer WX1 in the Z-direction.

A length Wd1 in the Y-direction of the first conductive layer overlap region WR1 is longer than a length Wd2 in the Y-direction of the first intermediate region WR2. A length Wd3 in the Y-direction of the first sub-conductive layer overlap region WR3 is longer than the length Wd2 of the first intermediate region WR2.

For example, two sub-conductive layers WX are provided to be separated from each other in a region overlapping the ith conductive layer WLi in the X-direction. For example, three sub-conductive layers WX are provided to be separated from each other in a region overlapping the (i+1)th conductive layer WL(i+1) in the X-direction.

As shown in FIG. 1C, the first contact plug CP1, the second contact plug CP2, the ith contact plug CPi, and the (i+1)th contact plug CP(i+1) are arranged in the X-direction. For example, the second contact plug CP2 is disposed between the first contact plug CP1 and the (i+1)th contact plug CP(i+1). The ith contact plug CPi is disposed between the second contact plug CP2 and the (i+1)th contact plug CP(i+1).

For example, the lengths in the Z-direction of the multiple contact plugs CP arranged in the X-direction are longer away from the memory region MR. For example, the order of the lengths in the Z-direction of the contact plugs CP is, from longer to shorter, the first contact plug CP1, the second contact plug CP2, the ith contact plug CPi, and the (i+1)th contact plug CP(i+1).

For example, as shown in FIG. 1A and FIG. 1B, an insulating unit 40, a first interconnect member LI1, and a second interconnect member LI2 are provided on the region of the foundation layer 10 (the semiconductor substrate) where the stacked body ML is not provided. The insulating unit 40 covers the end portion of the stacked body ML on the X-direction side.

For example, in the Y-direction, the stacked body ML is positioned between the first interconnect member LI1 and the second interconnect member LI2. For example, the first interconnect member LI1 has a plate configuration spreading along the X-Z plane. For example, the second interconnect member LI2 has a plate configuration spreading along the X-Z plane.

The first interconnect member LI1 includes a conductive unit 51 and an insulating unit 52. The insulating unit 52 is provided along the X-Z plane. The conductive unit 51 is provided inside the insulating unit 52. For example, the conductive unit 51 has a plate configuration spreading along the X-Z plane. The conductive unit 51 is electrically connected to the foundation layer 10.

The second interconnect member LI2 includes a conductive unit 53 and an insulating unit 54. The insulating unit 54 is provided along the X-Z plane. The conductive unit 53 is provided inside the insulating unit 54. For example, the conductive unit 53 has a plate configuration spreading along the X-Z plane. The conductive unit 53 is electrically connected to the foundation layer 10.

A method for manufacturing the semiconductor memory device according to the embodiment will now be described.

FIG. 6A to FIG. 15C are views of processes, showing the method for manufacturing the semiconductor memory device according to the embodiment.

Figure 6A:
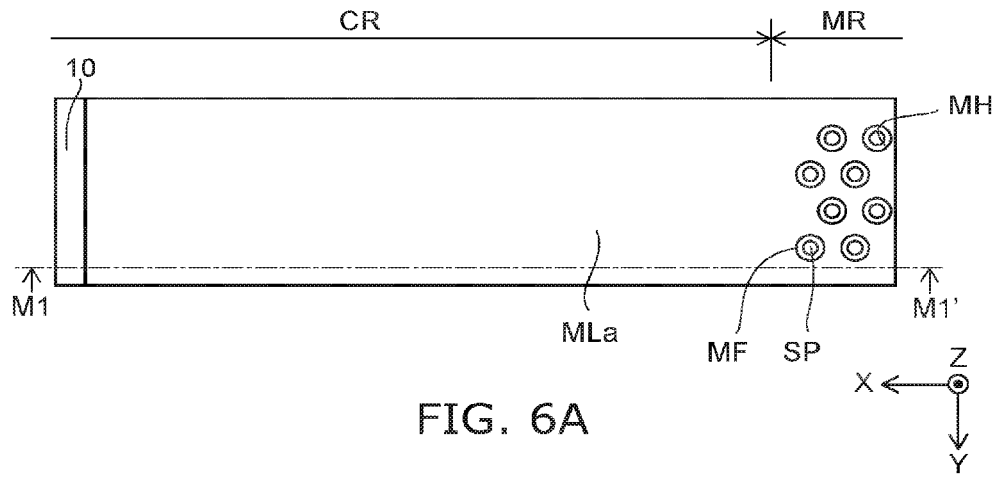
FIG. 6A to FIG. 15C are views of processes, showing the method for manufacturing the semiconductor memory device according to the first embodiment.
Figure 6B:
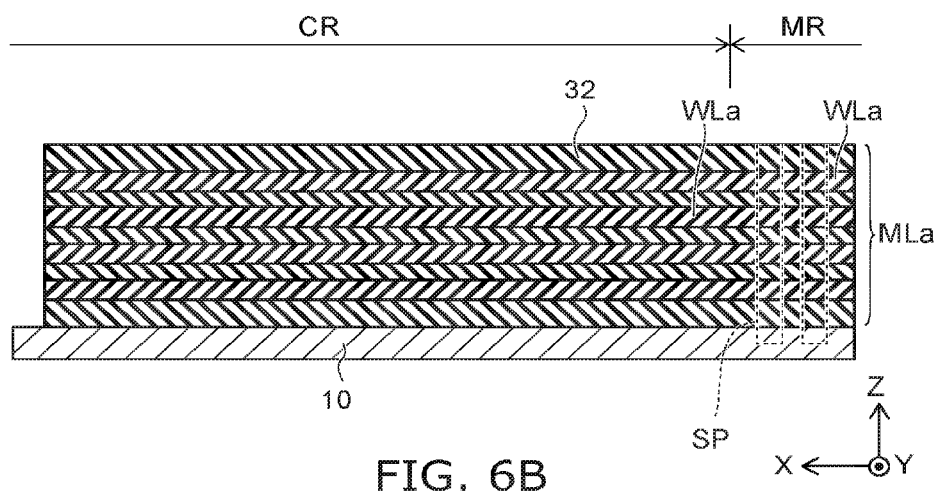

FIG. 6A is a process plan view showing the method for manufacturing the semiconductor memory device; and FIG. 6B is a cross-sectional view of the process, showing a cross section along line M1-M1' shown in FIG. 6A.

Figure 7A:
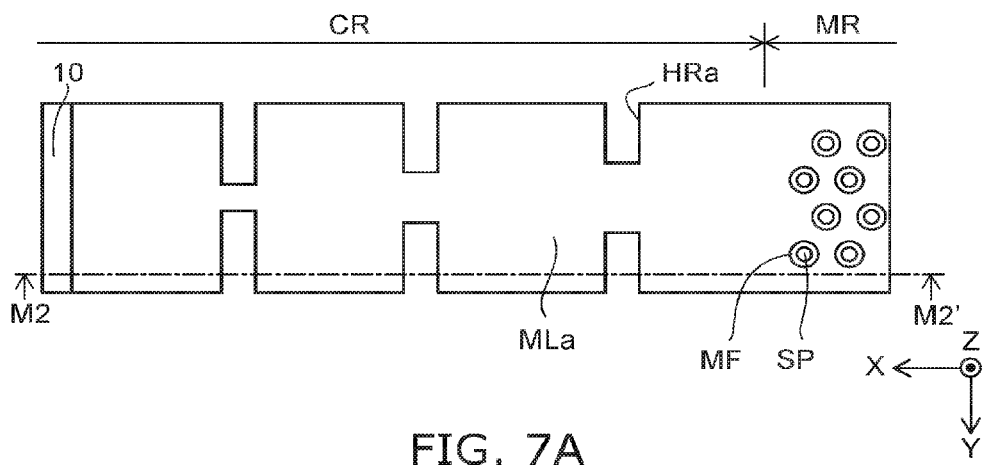
Figure 7B:
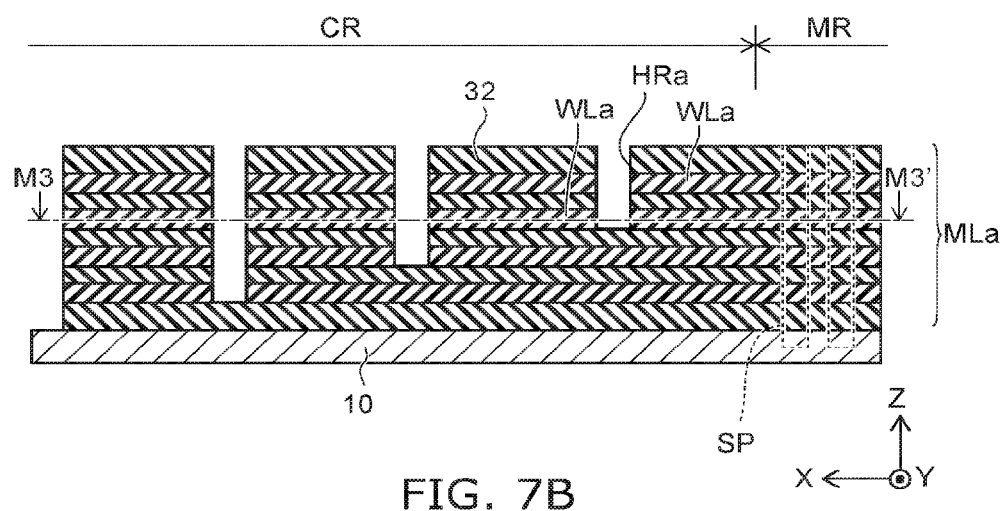
Figure 8A:
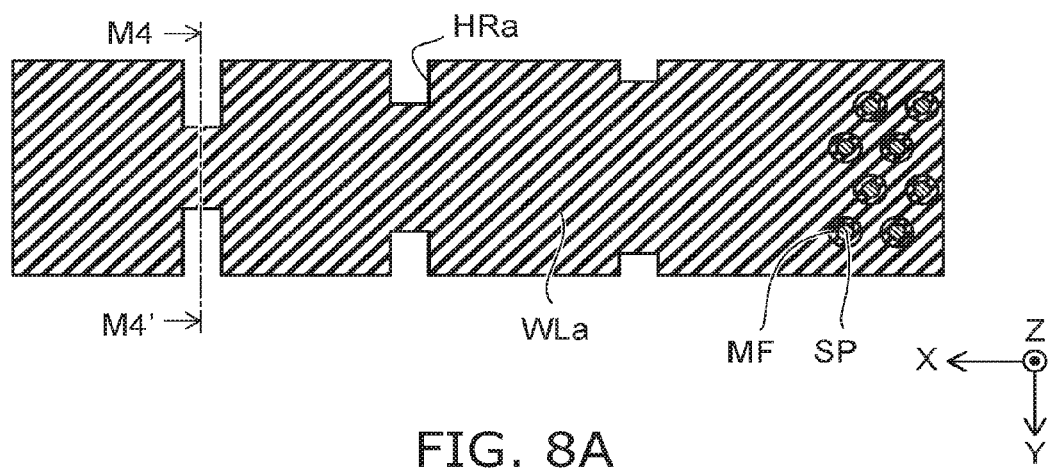
Figure 8B:
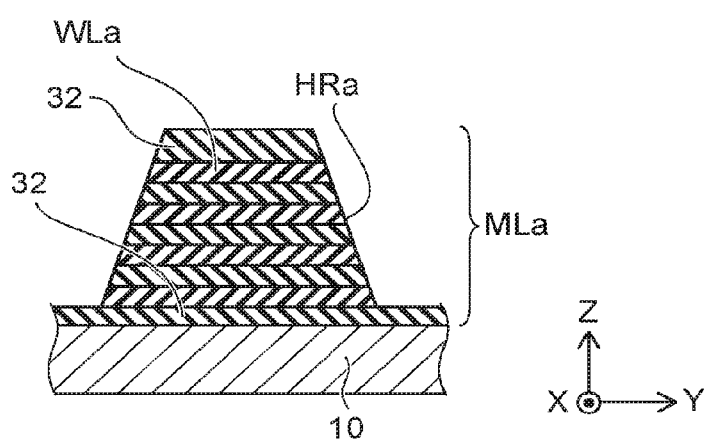

FIG. 7A is a process plan view showing the method for manufacturing the semiconductor memory device; FIG. 7B is a cross-sectional view of the process, showing a cross section along line M2-M2' shown in FIG. 7A; FIG. 8A is a cross-sectional view of the process, showing a cross section along line M3-M3' shown in FIG. 7B; and FIG. 8B is a cross-sectional view of the process, showing a cross section along line M4-M4' shown in FIG. 8A.

Figure 9A:
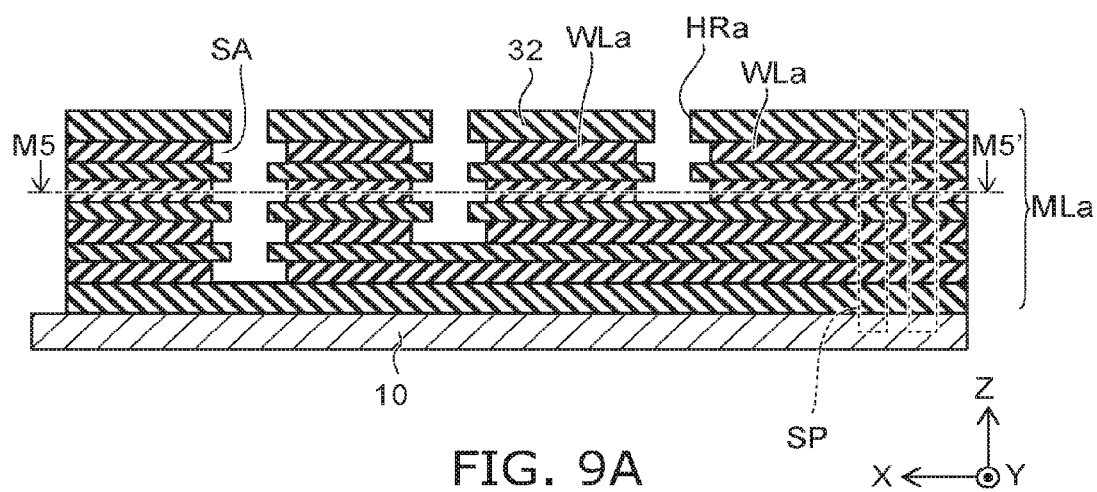
Figure 9B:
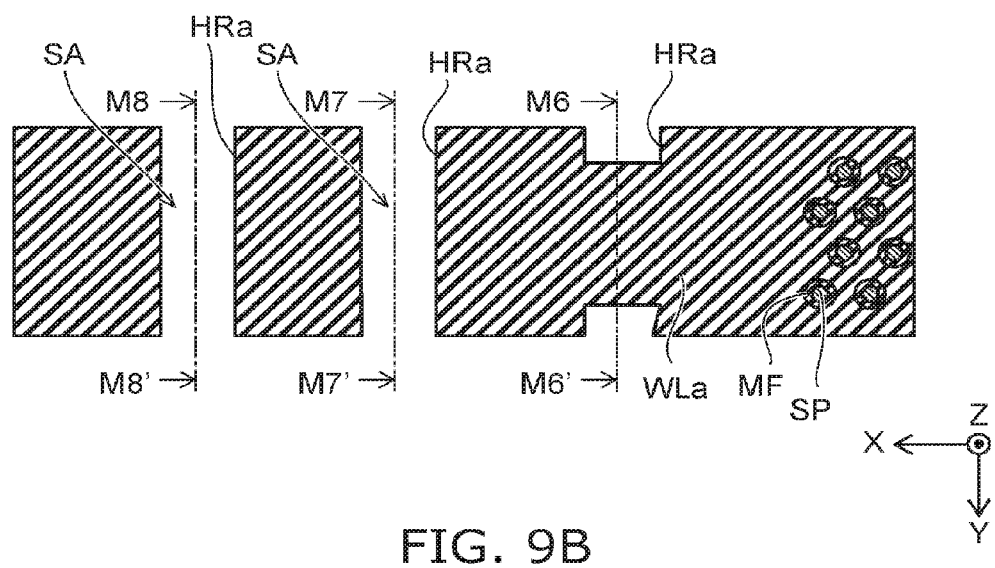
Figure 10A:
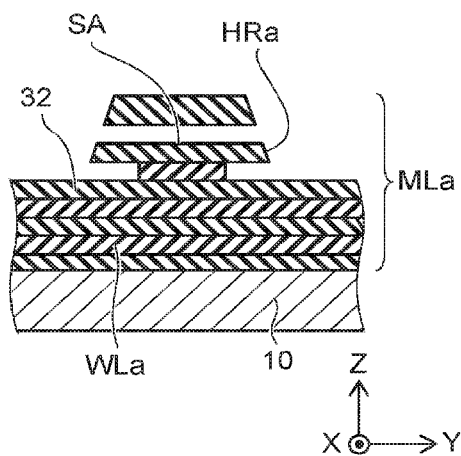
Figure 10B:
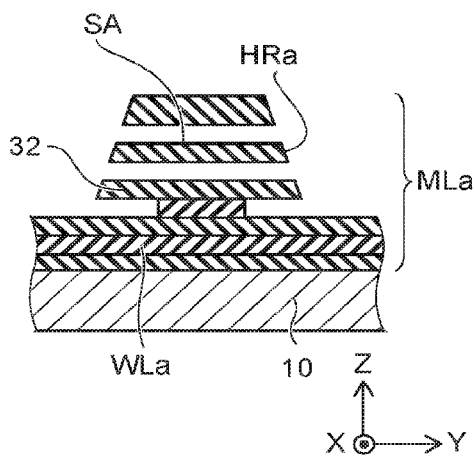
Figure 10C:
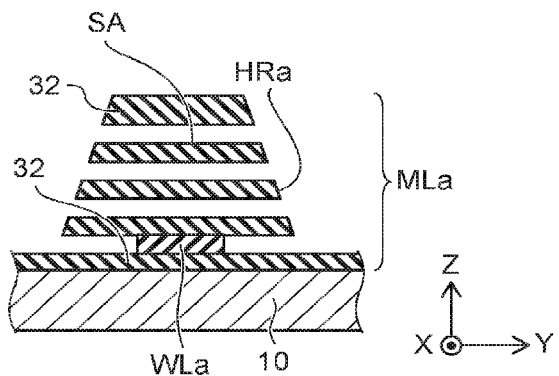

FIG. 9A is a cross-sectional view of a process, showing a cross section corresponding to the cross section along line M2-M2' shown in FIG. 7A; FIG. 9B is a cross-sectional view of the process, showing a cross section along line M5-M5' shown in FIG. 9A; FIG. 10A is a cross-sectional view of the process, showing a cross section along line M6-M6' shown in FIG. 9B; FIG. 10B is a cross-sectional view of the process, showing a cross section along line M7-M7' shown in FIG. 9B; and FIG. 10C is a cross-sectional view of the process, showing a cross section along line M8-M8' shown in FIG. 9B.

Figure 11A:
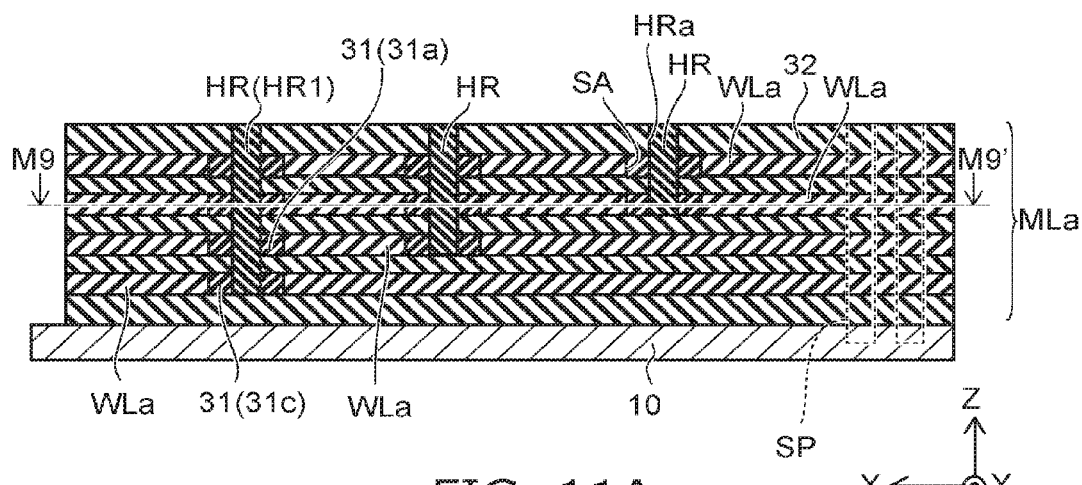
Figure 11B:
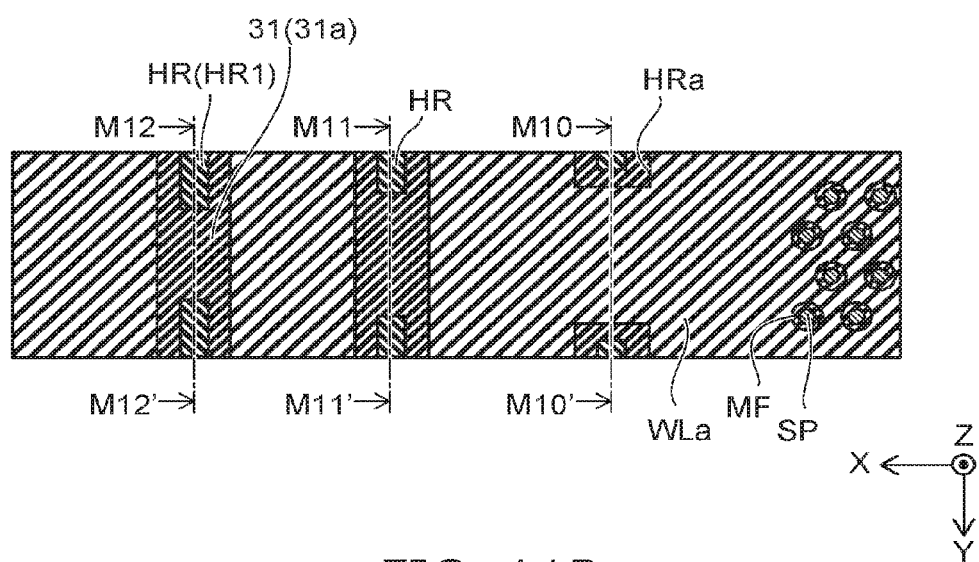
Figure 12A:
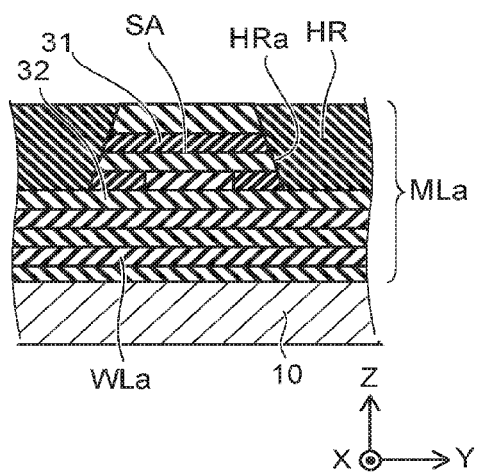
Figure 12B:
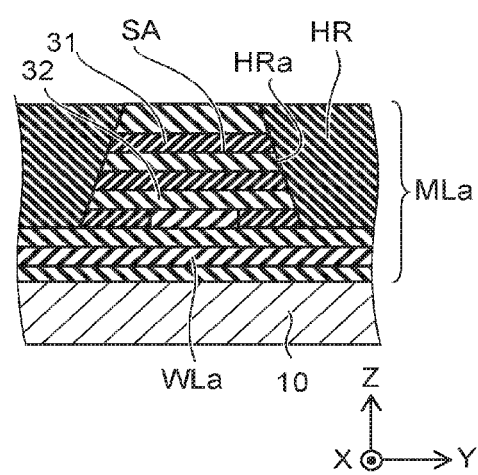
Figure 12C:
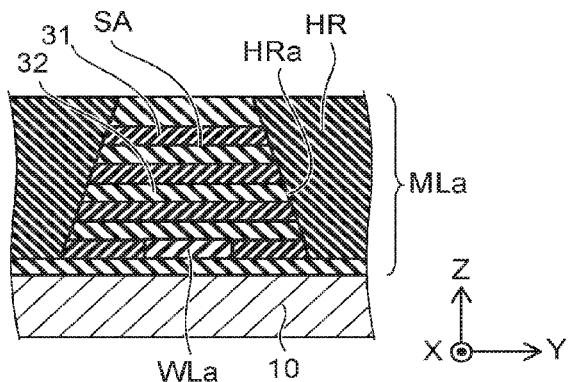

FIG. 11A is a cross-sectional view of a process, showing a cross section corresponding to the cross section along line M2-M2' shown in FIG. 7A; FIG. 11B is a process cross-sectional view along line M9-M9' shown in FIG. 11A; FIG. 12A is a cross-sectional view of the process, showing a cross section along line M10-M10' shown in FIG. 11B; FIG. 12B is a cross-sectional view of the process, showing a cross section along line M11-M11' shown in FIG. 11B; and FIG. 12C is a cross-sectional view of the process, showing a cross section along line M12-M12' shown in FIG. 11B.

Figure 13:
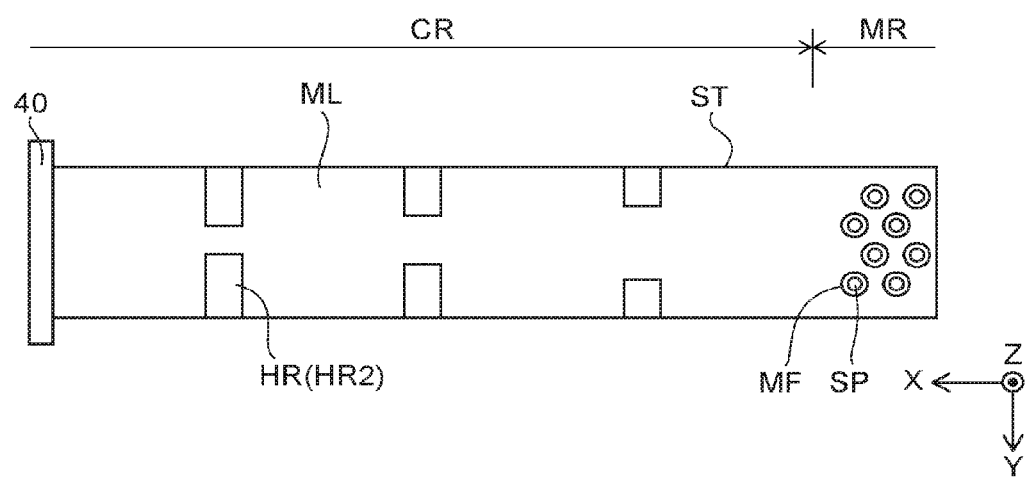
Figure 14A:
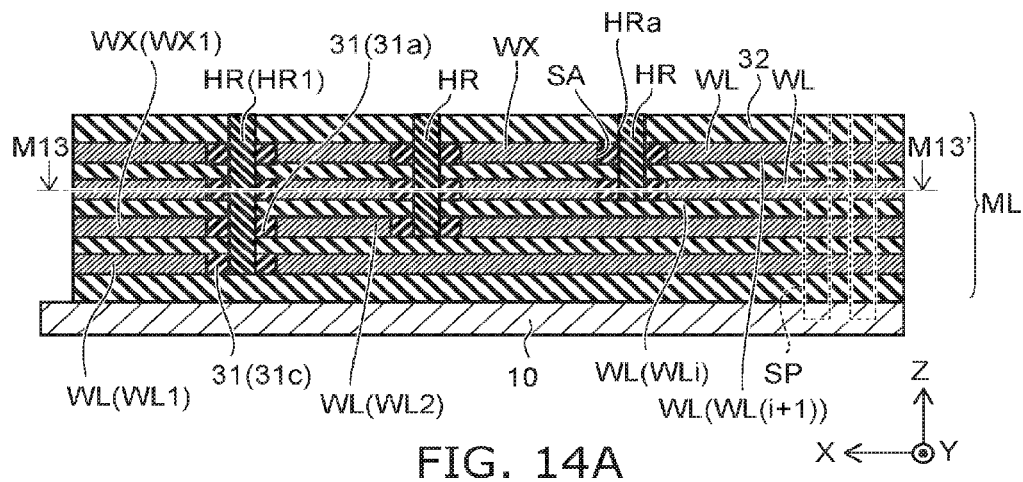

FIG. 13 is a process plan view showing the method for manufacturing the semiconductor memory device; FIG. 14A is a cross-sectional view of a process, showing a cross section corresponding to the cross section along line M2-M2' shown in FIG. 11A; and FIG. 14B is a process cross-sectional view along line M13-M13' shown in FIG. 14A.

Figure 14B:
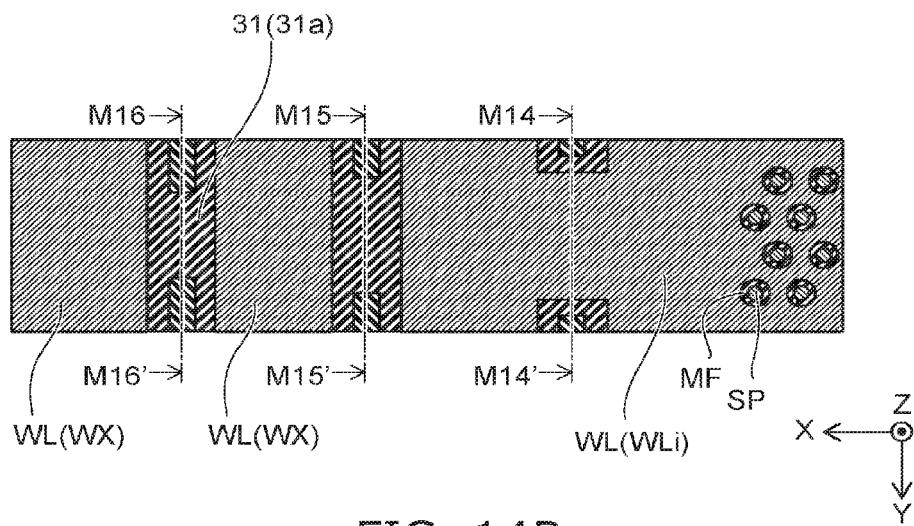
Figure 15A:
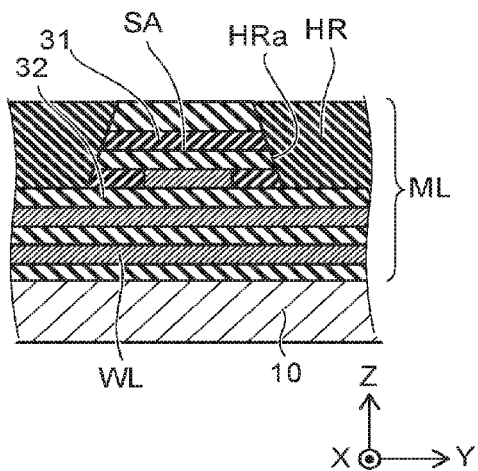
Figure 15B:
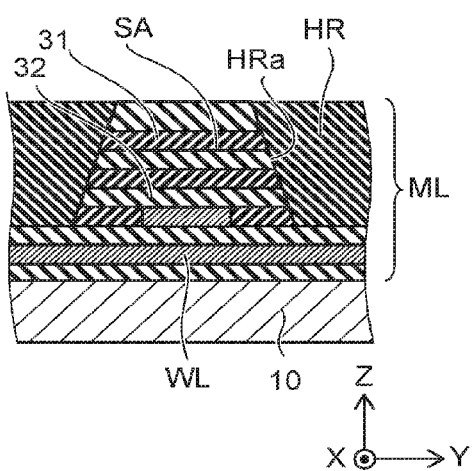
Figure 15C:
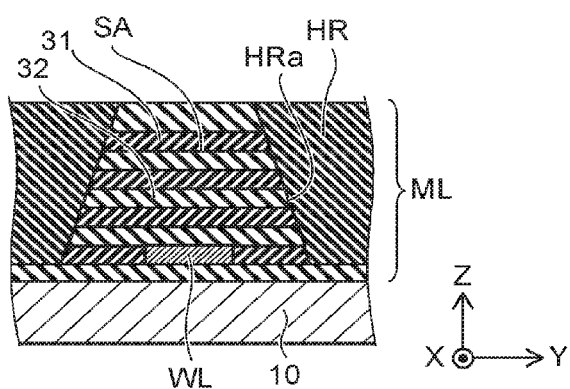

FIG. 15A is a cross-sectional view of the process, showing a cross section along line M14-M14' shown in FIG. 14B; FIG. 15B is a cross-sectional view of the process, showing a cross section along line M15-M15' shown in FIG. 14B; and FIG. 15C is a cross-sectional view of the process, showing a cross section along line M16-M16' shown in FIG. 14B.

As shown in FIG. 6A and FIG. 6B, a stacked body MLa that includes multiple sacrificial layers WLa is formed on the foundation layer 10 (the semiconductor substrate). As shown in FIG. 6B, the multiple sacrificial layers WLa are formed to be separated from each other in the Z-direction. For example, the stacked body MLa is formed by alternately stacking the multiple sacrificial layers WLa and the multiple inter-electrode insulating layers 32. For example, the sacrificial layers WLa are formed using a material including silicon nitride. For example, the inter-electrode insulating layers 32 are formed of a material including silicon oxide.

Multiple memory holes MH that pierce the stacked body MLa are made in the memory region MR.

As shown in FIG. 6A, the memory film MF is formed on the side walls of the memory holes MH. For example, the memory film MF is formed by stacking a blocking insulating film, a charge storage film, and a tunneling insulating film in this order. The semiconductor pillars SP are formed inside the memory holes MH. As shown in FIG. 6B, the semiconductor pillars SP are electrically connected to the foundation layer 10 (the semiconductor substrate).

As shown in FIG. 7A, multiple trenches HRa are made in the stacked body MLa. For example, the trenches HRa are made using patterning technology such as photolithography, etc. As shown in FIG. 7A and FIG. 7B, for example, the trenches HRa are made to be longer in the Z-direction and the Y-direction away from the memory region MR.

At this time, for example, as shown in FIG. 8A, the sacrificial layer WLa of the fourth layer from the uppermost layer of the stacked body MLa is a sacrificial layer WLa of one continuous layer in the connection region CR from the memory region MR.

As shown in FIG. 8B, the trench HRa is, for example, a trench having a substantially trapezoidal configuration. The length of the trench HRa in a direction (e.g., the Y-direction) orthogonal to the Z-direction decreases toward the bottom of the trench HRa. For example, the side surface of the trench HRa is tilted.

One portion of the sacrificial layers WLa is removed by performing wet etching via the trenches HRa. Thereby, as shown in FIG. 9A, hollow portions SA are made in the layers of the stacked body MLa where the sacrificial layers WLa were disposed. Thereby, some trenches HRa of the multiple trenches HRa adjacent to each other in the Y-direction communicate with each other via the hollow portions SA.

Here, two trenches HRa adjacent to each other in the Y-direction are taken as one set of trenches HRa. For example, as shown in FIG. 9B, for the sacrificial layer WLa of the fourth layer from the uppermost layer of the stacked body MLa, among the three sets of trenches HRa adjacent to each other in the Y-direction, the one set of trenches HRa that is second most proximal to the memory region MR communicates with each other via the hollow portion SA; and the one set of trenches HRa third most proximal to the memory region MR communicates with each other via another hollow portion SA.

As shown in FIG. 10A, in the cross section along line M6-M6' shown in FIG. 9B, one portion of the sacrificial layers WLa up to the fourth layer from the uppermost layer of the stacked body MLa is removed. Then, for the second layer from the uppermost layer of the stacked body MLa, the trenches HRa that are adjacent to each other in the Y-direction communicate with each other via the hollow portion SA. For the fourth layer from the uppermost layer, the sacrificial layer WLa remains between the trenches HRa adjacent to each other in the Y-direction.

The number of hollow portions SA linking the two trenches HRa adjacent to each other in the Y-direction is different according to the size of the two trenches HRa.

The size (e.g., the length in the Y-direction and the length in the Z-direction) of one set of trenches HRa adjacent to each other in the Y-direction decreases as the distance from the memory region MR decreases.

For example, the one set of trenches HRa most proximal to the memory region MR communicates with each other via the hollow portion SA made in the second layer from the uppermost layer of the stacked body MLa as described above.

As shown in FIG. 10B, the one set of trenches HRa second most proximal to the memory region MR communicates with each other via the hollow portions SA made in the second layer and the fourth layer from the uppermost layer of the stacked body MLa. As shown in FIG. 10C, the one set of trenches HRa third most proximal to the memory region MR communicates with each other via the hollow portions SA made in the second layer, the fourth layer, and the sixth layer from the uppermost layer of the stacked body MLa.

For example, the sacrificial layer WLa that is formed from the memory region MR to the connection region CR is divided in the X-direction by the portion where the trenches HRa communicate with each other. The position where the sacrificial layer WLa is divided is more proximal to the memory region MR toward the upper layer of the stacked body MLa.

As shown in FIG. 11A, an insulating material such as silicon oxide, etc., is provided inside the trenches HRa and the hollow portions SA. Thereby, the insulating films HR are formed inside the trenches HRa. The insulating layers 31 are formed inside the hollow portions SA.

Thereby, as shown in FIG. 11B, the insulating layers 31 are formed between the sacrificial layers WLa divided by the wet etching described above.

For example, as shown in FIG. 12A, the insulating layers 31 are formed in the second layer and the fourth layer from the upper layer of the stacked body MLa in the cross section corresponding to the cross section along line M10-M10' shown in FIG. 11B. In this cross section, the insulating layers 31 that are formed in the second layer from the upper layer of the stacked body MLa become one continuous insulating layer 31 between the two insulating films HR adjacent to each other in the Y-direction. In this cross section, two insulating layers 31 are formed in the fourth layer from the upper layer of the stacked body MLa. One portion of the sacrificial layer WLa is disposed between the two insulating layers 31.

For example, as shown in FIG. 12B, the insulating layers 31 are formed in the second layer, the fourth layer, and the sixth layer from the upper layer of the stacked body MLa in the cross section corresponding to the cross section along line M11-M11' shown in FIG. 11B. In this cross section, the insulating layers 31 formed in each of the second layer and the fourth layer from the upper layer of the stacked body MLa become one continuous insulating layer 31 between the two insulating films HR adjacent to each other in the Y-direction. In this cross section, two insulating layers 31 are formed in the sixth layer from the upper layer of the stacked body MLa. One portion of the sacrificial layer WLa is disposed between the two insulating layers 31.

For example, as shown in FIG. 12C, the insulating layers 31 are formed in the second layer, the fourth layer, the sixth layer, and the eighth layer from the upper layer of the stacked body MLa in the cross section corresponding to the cross section along line M12-M12' shown in FIG. 11B. In this cross section, the insulating layers 31 formed in each of the second layer and the fourth layer from the upper layer of the stacked body MLa become one continuous insulating layer 31 between the two insulating films HR adjacent to each other in the Y-direction. In this cross section, two insulating layers 31 are formed in the eighth layer from the upper layer of the stacked body MLa. One portion of the sacrificial layer WLa is disposed between the two insulating layers 31.

Then, as shown in FIG. 13, a slit ST is made in the stacked body ML. For example, the slit ST has a trench configuration spreading in the X-direction and the Z-direction. Wet etching is performed via the slit ST. Thereby, the sacrificial layers WLa of the stacked body MLa are removed.

As shown in FIG. 14A, a conductive material such as, for example, tungsten or the like is provided in the space where the sacrificial layers WLa were removed. Thereby, the multiple conductive layers WL are formed in the space where the sacrificial layers WLa were removed. Thereby, the stacked body MLa becomes the stacked body ML that includes the multiple conductive layers WL. The multiple conductive layers WL include, for example, the first conductive layer WL1, the second conductive layer WL2, the ith conductive layer WLi, and the (i+1)th conductive layer WL(i+1). The multiple conductive layers WL include, for example, the multiple sub-conductive layers WX.

For example, the first conductive layer WL1, the second conductive layer WL2, the ith conductive layer WLi, and the (i+1)th conductive layer WL(i+1) are disposed in this order from the foundation layer 10 side. The first conductive layer WL1, the second conductive layer WL2, the ith conductive layer WLi, and the (i+1)th conductive layer WL(i+1) are formed continuously from the memory region MR to the connection region CR. The multiple sub-conductive layers WX are formed to be separated from the first conductive layer WL1, the second conductive layer WL2, the ith conductive layer WLi, and the (i+1)th conductive layer WL(i+1).

For example, as shown in FIG. 14B, the ith conductive layer WLi is formed from the memory region MR to the connection region CR. In the connection region CR, two sub-conductive layers WX are provided to be separated from each other in a region overlapping the ith conductive layer WLi in the X-direction. The sub-conductive layer WX and the ith conductive layer WLi are separated by the insulating layer 31 and the insulating films HR. In other words, the ith conductive layer WLi is electrically isolated from the two sub-conductive layers WX. Also, the two sub-conductive layers WX are separated from each other by another insulating layer 31 and other insulating films HR. In other words, the two sub-conductive layers WX that are formed to be separated from each other in the X-direction are electrically isolated from each other.

For example, as shown in FIG. 15A, the conductive layer WL of the second layer from the uppermost layer of the stacked body ML is divided by the insulating layer 31 in the cross section along line M14-M14' shown in FIG. 14B. For example, as shown in FIG. 15B, the conductive layers WL of the second layer and the fourth layer from the uppermost layer of the stacked body ML are divided by the insulating layers 31 in the cross section along line M15-M15' shown in FIG. 14B. As shown in FIG. 15C, the conductive layers WL of the second layer, the fourth layer, and the sixth layer from the uppermost layer of the stacked body ML are divided by the insulating layers 31 in the cross section along line M16-M16' shown in FIG. 14B.

As shown in FIG. 1A, the insulating unit 52 is formed on the side wall of the slit ST. Subsequently, a conductive material such as tungsten or the like is provided inside the slit ST. Thereby, the conductive unit 52 is formed inside the slit ST. Thereby, the first interconnect member LI1 that includes the conductive unit 51 and the insulating unit 52 is formed. At this time, for example, the conductive unit 53 and the insulating unit 54 are formed inside one other slit ST. Thereby, the second interconnect member LI2 is formed inside the one other slit ST. For example, the insulating unit 40 is formed in the region on the foundation layer 10 where the stacked body ML is not provided.

Subsequently, the multiple contact plugs CP are formed in the stacked body ML.

The method for forming the contact plugs CP will now be described.

Figure 16A:
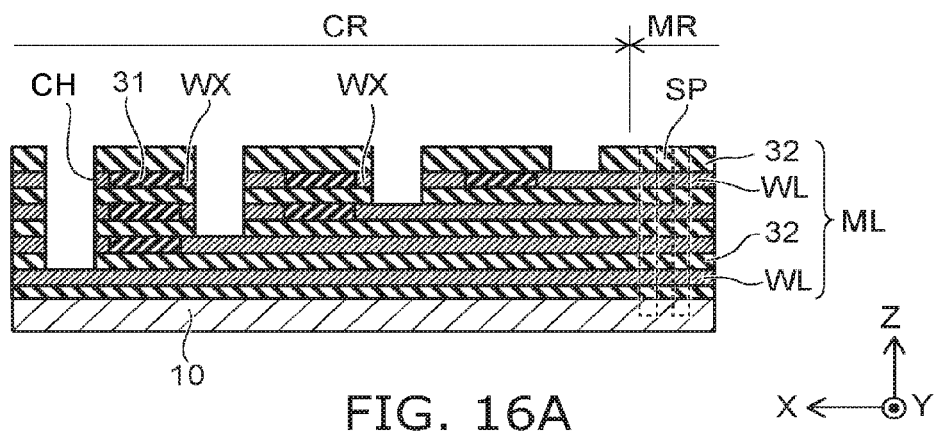
FIG. 16A and FIG. 16B are cross-sectional views of processes, showing the method for forming a contact plugs.
Figure 16B:
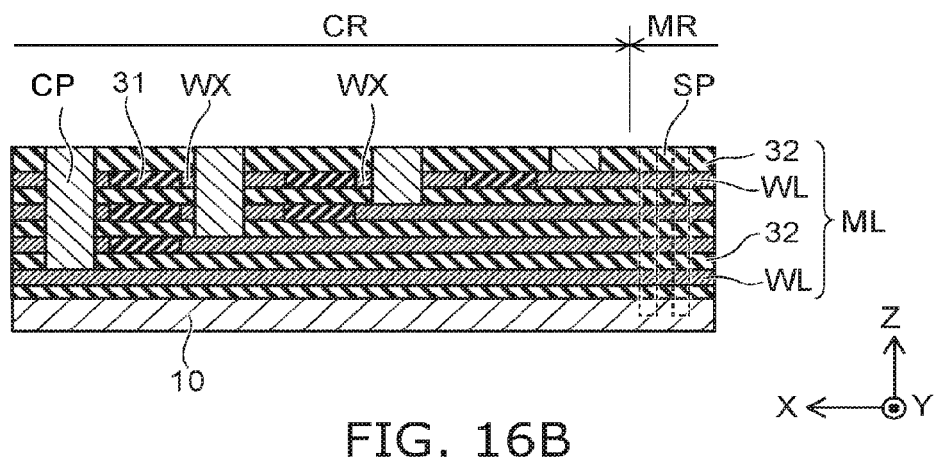

FIG. 16A and FIG. 16B are cross-sectional views of processes, showing the method for forming the contact plugs.

FIG. 16A and FIG. 16B are cross-sectional views showing a cross section corresponding to the cross section along line L2-L2' shown in FIG. 1A.

As shown in FIG. 16A, multiple contact holes CH are made in the stacked body ML in the connection region CR. Each of the contact holes CH reaches one of the conductive layers WL extending to be continuous from the memory region MR.

As shown in FIG. 16B, a conductive material such as tungsten or the like is provided inside the contact holes CH. Thereby, the contact plugs CP are formed inside the contact holes CH. The contact plug CP is electrically connected to one of the conductive layers WL extending to be continuous from the memory region MR. Some of the contact plugs CP also are electrically connected to the sub-conductive layers WX formed to be separated from the conductive layers WL extending from the memory region MR.

An example of another method for forming the contact plugs CP will now be described.

Figure 17A:
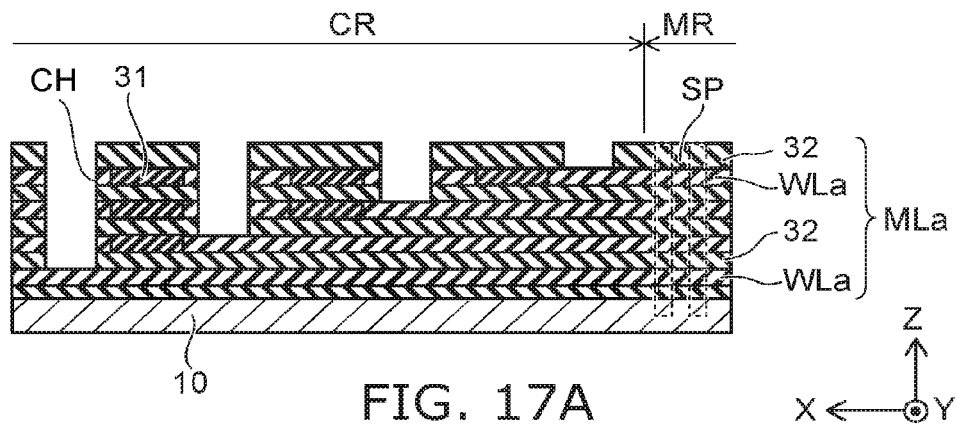
FIG. 17A to FIG. 17C are cross-sectional views of processes, showing the example of the method for forming the contact plugs.
Figure 17B:
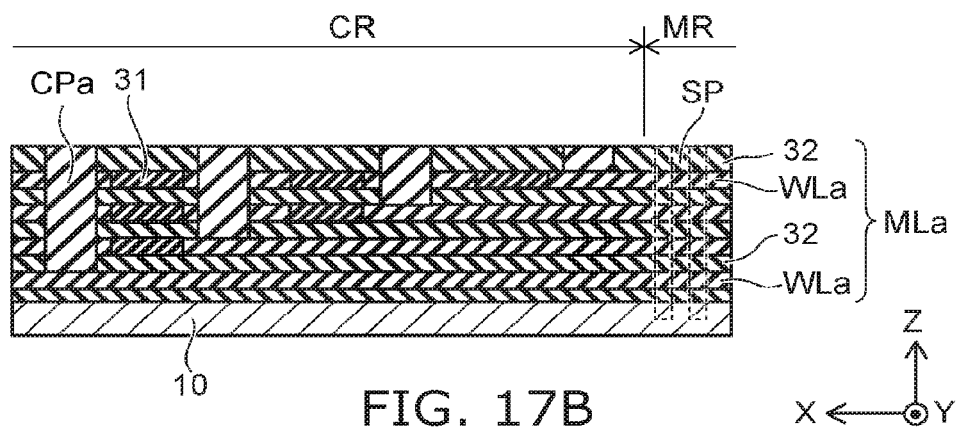
Figure 17C:
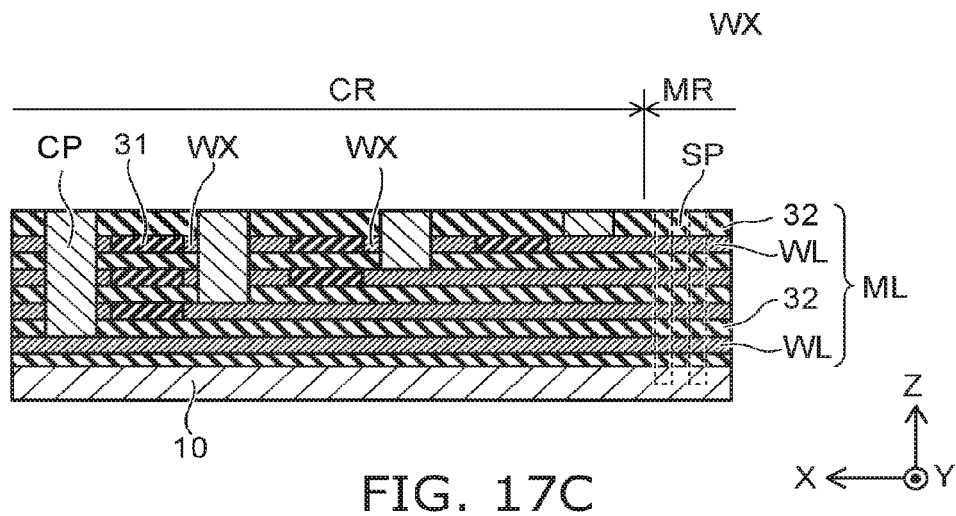

FIG. 17A to FIG. 17C are cross-sectional views of processes, showing the example of the method for forming the contact plugs.

FIG. 17A to FIG. 17C are cross-sectional views corresponding to the cross section along line L2-L2' shown in FIG. 1.

In the example, after implementing the processes up to the processes shown in FIG. 11A to FIG. 12C, the multiple contact holes CH are made in the stacked body MLa as shown in FIG. 17A. Each of the contact holes CH reaches one of the sacrificial layers WLa extending to be continuous from the memory region MR.

As shown in FIG. 17B, sacrificial members CPa are provided inside the contact holes CH. For example, the sacrificial members CPa are formed of a material including silicon nitride.

Subsequently, the processes shown in FIG. 13 to FIG. 15C are implemented. Thereby, the sacrificial members CPa also are removed with the sacrificial layers WLa. A conductive material such as tungsten or the like is provided inside the contact holes CH. Thereby, the contact plugs CP are formed inside the contact holes CH. The contact plug CP is electrically connected to one of the conductive layers WL extending to be continuous from the memory region MR. Some of the contact plugs CP pass through prescribed sub-conductive layers WX and are electrically connected to one of the conductive layers WL extending from the memory region MR.

The semiconductor memory device 100 according to the embodiment is manufactured by the processes described above.

In the case where one contact plug CP is connected to every conductive layer WL of the stacked body ML, it may be considered to form a stepped portion every two layers of the end portion of the stacked body ML. One contact plug CP is formed on each portion formed into the stairstep configuration. For example, the stepped portions are formed by repeating etching using a mask and slimming of the mask. In such a case, the lithography processes are performed many times according to the number of stepped portions. Accordingly, the manufacturing processes increase as the number of layers of the stacked body ML increases.

In the semiconductor memory device 100 according to the embodiment, the contact plug CP can be electrically connected to one of the conductive layers WL provided to be continuous from the prescribed memory region MR without forming the stepped portions in the stacked body ML. Accordingly, the processes of forming the stepped portions in the stacked body ML can be reduced.

In an example other than the embodiment described above, it may be considered to form stepped portions every two layers, subsequently cover the stepped portions with an insulating material, and implement planarization such as CMP (Chemical mechanical planarization), etc. At this time, there are cases where a concavity or the like occurs on the stepped portions. Subsequently, when forming the contact plugs CP, the interconnects, etc., on the stepped portions, the yield may degrade due to the concavity.

In the embodiment, the occurrence of the concavity or the like can be suppressed because the stepped portions are not formed in the stacked body ML. Thereby, the yield increases when forming the interconnects, etc., on the stacked body ML. Accordingly, the process cost decreases.

In the semiconductor memory device, strain may occur in the device due to a stress difference due to different materials. By providing the sub-conductive layers WX, the distribution of the material is uniform; and the strain can be suppressed. For example, the precision can be increased; and a high yield is obtained.

A second embodiment will now be described.

Figure 18:
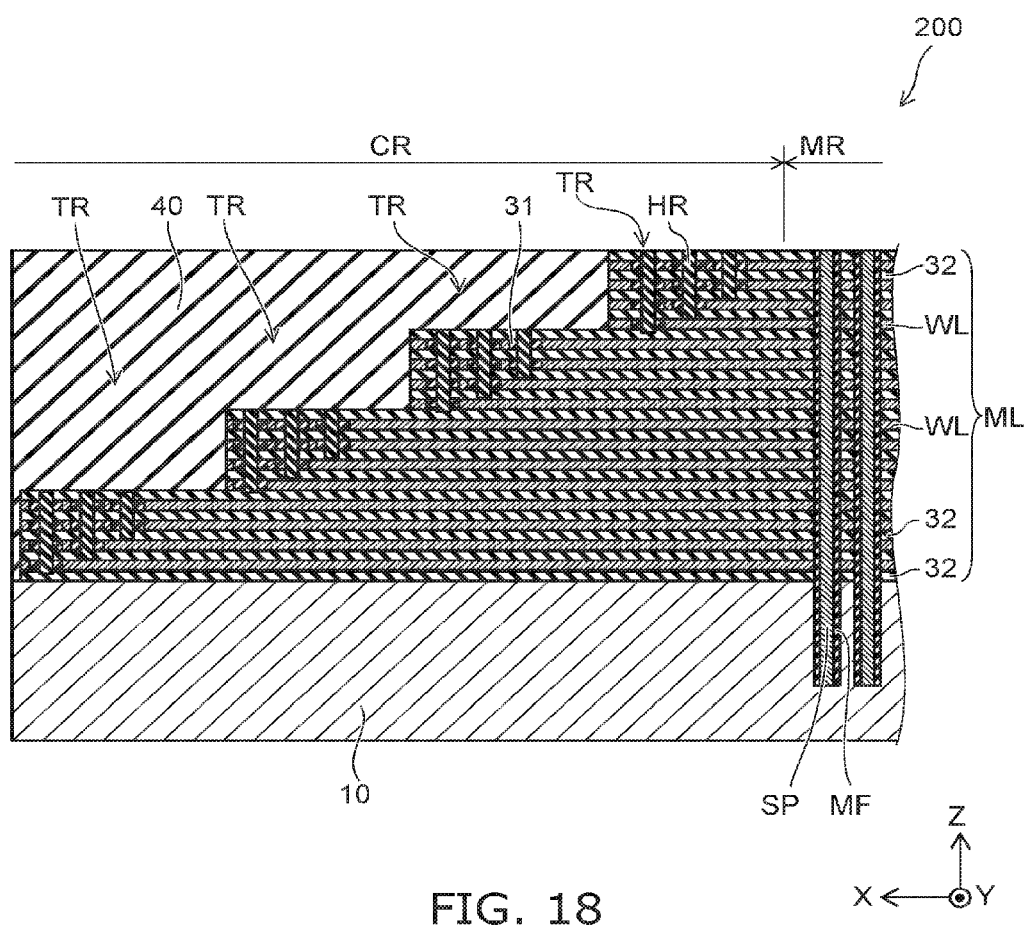
FIG. 18 is a cross-sectional view showing a semiconductor memory device according to a second embodiment.
Figure 19:
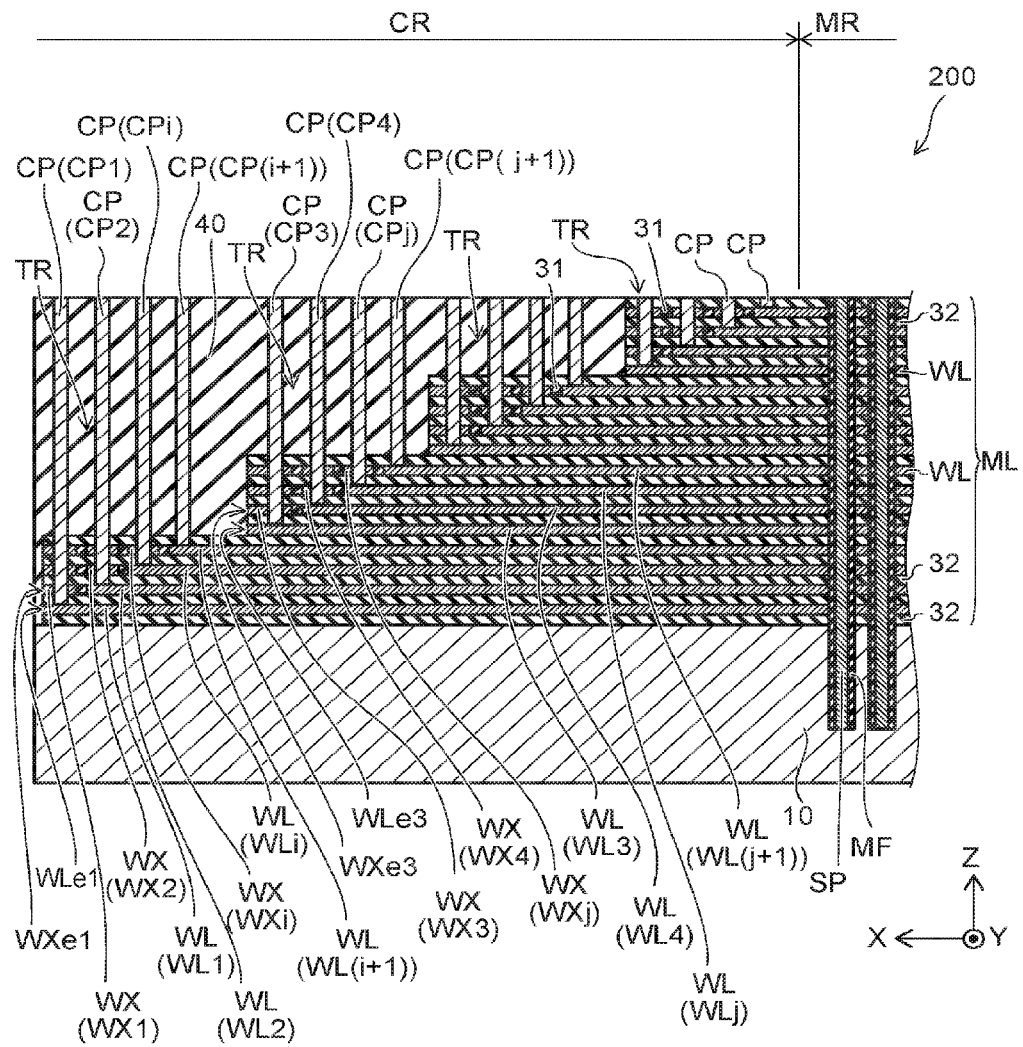
FIG. 19 is cross-sectional view showing a semiconductor memory device according to a second embodiment.

FIG. 18 and FIG. 19 are cross-sectional views showing a semiconductor memory device according to the embodiment.

Figure 20:
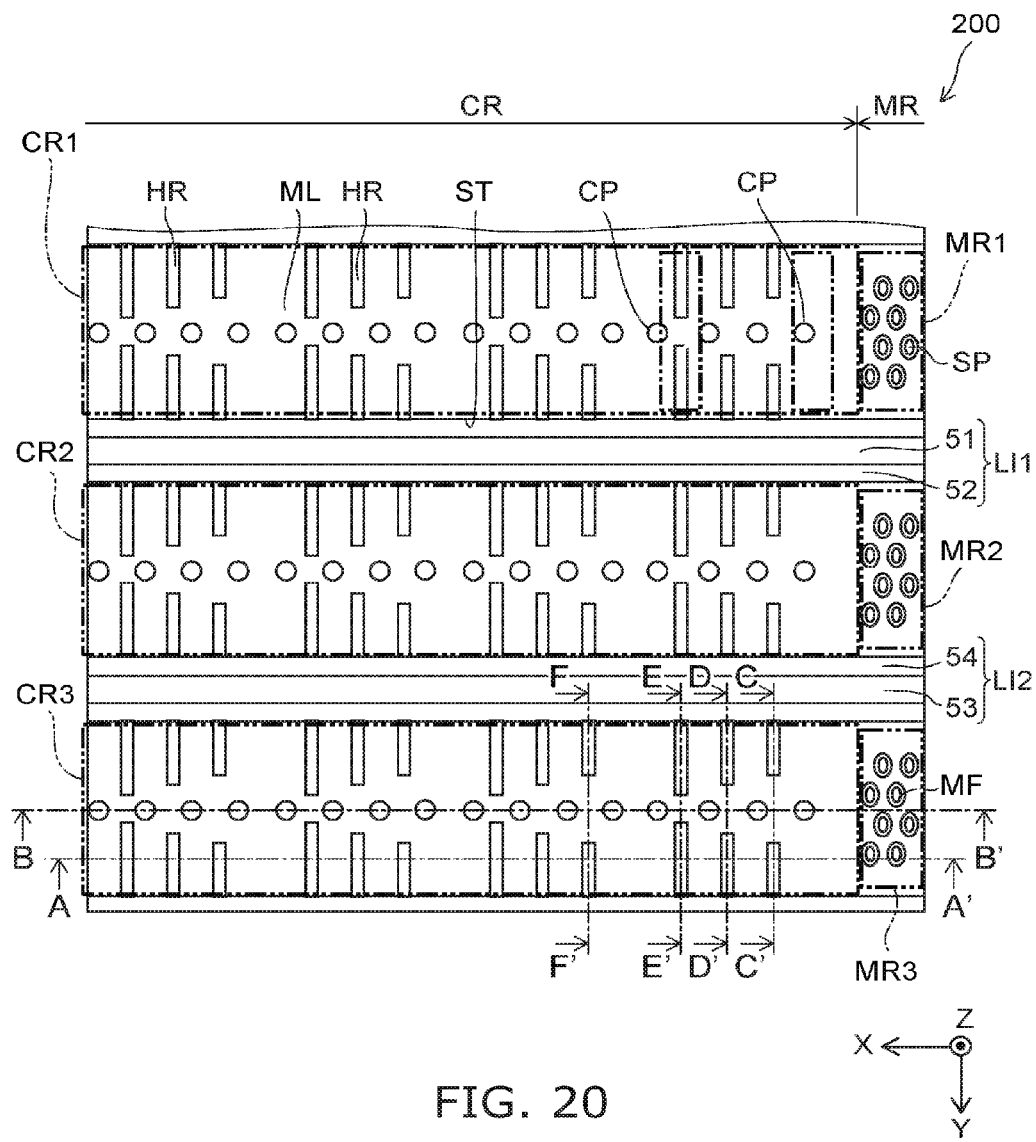
FIG. 20 is a plan view showing the second semiconductor memory device according to the embodiment.

FIG. 20 is a plan view showing the semiconductor memory device according to the embodiment.

FIG. 18 is a cross-sectional view showing a cross section along line A-A' shown in FIG. 20. FIG. 19B is a cross-sectional view showing a cross section along line B-B' shown in FIG. 20.

As shown in FIG. 18, in the semiconductor memory device 200 according to the embodiment, stepped portions are provided in the end portion of the stacked body ML in the connection region CR. In the embodiment, the difference in levels of one step of the stacked body ML is provided so that the layers arranged in the Z-direction are not less than four layers.

Hereinbelow, an example is described in the description of the embodiment in which four stepped portions are provided with one stepped portion every eight layers. However, the number of layers and the number of stepped portions that are arranged in the Z-direction and included in the stepped portions of the embodiment are not limited thereto.

In the connection region CR, each region between the difference in levels provided in the stacked body ML and another difference in levels provided in the stacked body ML is taken as a terrace region TR. The region in the connection region CR that includes the uppermost layer of the stacked body ML also is one terrace region TR. For example, the terrace region TR is at every level of the stepped portions of the stacked body ML.

The insulating unit 40 is provided on the terrace regions TR other than the terrace region TR that includes the uppermost layer of the stacked body ML. For example, the insulating unit 40 also is provided in the region on the foundation layer 10 where the stacked body ML is not provided.

As shown in FIG. 18 and FIG. 19, the multiple insulating films HR and the multiple insulating layers 31 are provided in each of the terrace regions TR.

The multiple conductive layers WL include, for example, the first conductive layer WL1, the second conductive layer WL2, the ith conductive layer WLi, the (i+1)th conductive layer WL(i+1), a third conductive layer WL3, a fourth conductive layer WL4, a jth conductive layer WLj, and a (j+1)th conductive layers WL(j+1). The multiple conductive layers WL include, for example, the multiple sub-conductive layers WX. In the embodiment, i is an integer. In the embodiment, j is an integer.

The first conductive layer WL1, the second conductive layer WL2, the ith conductive layer WLi, the (i+1)th conductive layer WL(i+1), the third conductive layer WL3, the fourth conductive layer WL4, the jth conductive layer WLj, and the (j+1)th conductive layer WL(j+1) are disposed to be separated from each other in the Z-direction.

Each of the first conductive layer WL1, the second conductive layer WL2, the ith conductive layer WLi, the (i+1)th conductive layer WL(i+1), the third conductive layer WL3, the fourth conductive layer WL4, the jth conductive layer WLj, and the (j+1)th conductive layer WL(j+1) is provided to be continuous from the memory region MR.

The multiple sub-conductive layers WX are disposed to be separated from the first conductive layer WL1, the second conductive layer WL2, the ith conductive layer WLi, the (i+1)th conductive layer WL(i+1), the third conductive layer WL3, the fourth conductive layer WL4, the jth conductive layer WLj, and the (j+1)th conductive layer WL(j+1).

For example, in the stacked body ML, the first conductive layer WL1, the second conductive layer WL2, the ith conductive layer WLi, the (i+1)th conductive layer WL(i+1), the third conductive layer WL3, the fourth conductive layer WL4, the jth conductive layer WLj, and the (j+1)th conductive layer WL(j+1) are arranged in this order from the foundation layer 10 side.

The multiple sub-conductive layers WX include, for example, the first sub-conductive layer WX1, a second sub-conductive layer WX2, a third sub-conductive layer WX3, an ith sub-conductive layer WXi, and a jth sub-conductive layer WXj.

The first sub-conductive layer WX1 is arranged with the second conductive layer WL2 in the X-direction. The first sub-conductive layer WX1 overlaps one portion of the first conductive layer WL1 in the Z-direction.

The second sub-conductive layer WX2 is arranged with the ith conductive layer WLi in the X-direction. The second sub-conductive layer WX2 overlaps one portion of the second conductive layer WL2 in the Z-direction.

The third sub-conductive layer WX3 is arranged with the second conductive layer WL2 in the X-direction. The third sub-conductive layer WX3 overlaps one portion of the third conductive layer WL3 in the Z-direction.

The ith sub-conductive layer WXi is arranged with the (i+1)th conductive layer WL(i+1) in the X-direction. The ith sub-conductive layer WXi overlaps one portion of the ith conductive layer WLi in the Z-direction.

The jth sub-conductive layer WXj is arranged with the (j+1)th conductive layer WL(j+1) in the X-direction. The jth sub-conductive layer WXj overlaps one portion of the jth conductive layer WLj in the Z-direction.

The first conductive layer WL1 includes an end portion on the semiconductor pillar SP side. The first conductive layer WL1 includes a first conductive layer end portion WLe1 on the side opposite to the end portion on the semiconductor pillar SP side. The third sub-conductive layer WX3 includes an end portion on the semiconductor pillar SP side. The first sub-conductive layer WX1 includes a first sub-conductive layer end portion WXe1 on the side opposite to the end portion on the semiconductor pillar side.

For example, the direction from the first conductive layer end portion WLe1 toward the first sub-conductive layer end portion WXe1 is along the Z-direction.

The third conductive layer WL3 includes an end portion on the semiconductor pillar SP side. The first conductive layer WL includes a third conductive layer end portion WLe3 on the side opposite to the semiconductor pillar SP side. The third sub-conductive layer WX3 includes an end portion on the semiconductor pillar SP side. The third sub-conductive layer WX3 includes a third sub-conductive layer end portion WXe3 on the side opposite to the end portion on the semiconductor pillar SP side.

For example, the direction from the third conductive layer end portion WLe3 toward the third sub-conductive layer end portion WXe3 is along the Z-direction.

The position along the X-direction of the third conductive layer end portion WLe3 is positioned between the semiconductor pillar SP and the position along the X-direction of the first conductive layer end portion WLe1. The position along the X-direction of the third sub-conductive layer end portion WXe3 is positioned between the semiconductor pillar SP and the position along the X-direction of the first sub-conductive layer end portion WXe1.

As shown in FIG. 19, the multiple contact plugs CP are provided in the semiconductor memory device 200. For example, the multiple contact plugs CP have substantially circular columnar configurations extending in the Z-direction.

The multiple contact plugs CP include the first contact plug CP1, the second contact plug CP2, the ith contact plug CPi, the (i+1)th contact plug CP(i+1), a third contact plug CP3, a fourth contact plug CP4, a jth contact plug CPj, and a (j+1)th contact plug CP(j+1).

For example, the first contact plug CP1, the second contact plug CP2, the ith contact plug CPi, the (i+1)th contact plug CP(i+1), the third contact plug CP3, the fourth contact plug CP4, the jth contact plug CPj, and the (j+1)th contact plug CP(j+1) are arranged in one column along the X-direction.

For example, in the order of most distal to the memory region MR to most proximal, the first contact plug CP1, the second contact plug CP2, the ith contact plug CPi, the (i+1)th contact plug CP(i+1), the third contact plug CP3, the fourth contact plug CP4, the jth contact plug CPj, and the (j+1)th contact plug CP(j+1) are disposed in this order.

The first contact plug CP1 extends in the Z-direction through the insulating unit 40 and is electrically connected to the first conductive layer WL1. For example, the first contact plug CP1 passes through the first sub-conductive layer WX1 and is electrically connected to the first conductive layer WL1.

The second contact plug CP2 extends in the Z-direction through the insulating unit 40 and is electrically connected to the second conductive layer WL2. For example, the second contact plug CP2 passes through the second sub-conductive layer WX2 and is electrically connected to the second conductive layer WL2.

The ith contact plug CPi extends in the Z-direction through the insulating unit 40 and is electrically connected to the ith conductive layer WLi. For example, the ith contact plug CPi passes through the ith sub-conductive layer WXi and is electrically connected to the ith conductive layer WLi.

The (i+1)th contact plug CP(i+1) extends in the Z-direction through the insulating unit 40 and is electrically connected to the (i+1)th conductive layer WL(i+1).

The third contact plug CP3 extends in the Z-direction through the insulating unit 40 and is electrically connected to the third conductive layer WL3. For example, the third contact plug CP3 passes through the third sub-conductive layer WX3 and is electrically connected to the third conductive layer WL3.

The fourth contact plug CP4 extends in the Z-direction through the insulating unit 40 and is electrically connected to the fourth conductive layer WL4. For example, the fourth contact plug CP4 passes through a fourth sub-conductive layer WX4 and is electrically connected to the fourth conductive layer WL4.

The jth contact plug CPj extends in the Z-direction through the insulating unit 40 and is electrically connected to the jth conductive layer WLj. For example, the jth contact plug CPj passes through the jth sub-conductive layer WXj and is electrically connected to the jth conductive layer WLj.

The (j+1)th contact plug CP(j+1) extends in the Z-direction through the insulating unit 40 and is electrically connected to the (j+1)th conductive layer WL(j+1).

As shown in FIG. 20, multiple memory regions MR may be set in the semiconductor memory device 200. For example, the multiple memory regions MR include a first memory region MR1, a second memory region MR2, and a third memory region MR3.

Multiple connection regions CR may be set in the semiconductor memory device 200. The multiple connection regions CR include, for example, a first connection region CR1, a second connection region CR2, and a third connection region CR3.

The first memory region MR1 and the first connection region CR1 are continuous in the X-direction. The second memory region MR2 and the second connection region CR2 are continuous in the X-direction. The third memory region MR3 and the third connection region CR3 are continuous in the X-direction.

In the Y-direction, the first memory region MR1, the second memory region MR2, and the third memory region MR3 are arranged in this order. In the Y-direction, the first connection region CR1, the second connection region CR2, and the third connection region CR3 are arranged in this order.

Multiple connection members LI are provided in the semiconductor memory device 200. The connection members LI include the first interconnect member LI1 and the second interconnect member LI2.

The first interconnect member LI1 is provided between the first memory region MR1 and the second memory region MR2 and between the third connection region CR3 and the second connection region CR2. The second interconnect member LI2 is provided between the second memory region MR2 and the third memory region MR3 and between the first connection region CR1 and the second connection region CR2.

The first interconnect member LI1 includes the conductive unit 51 and the insulating unit 52. For example, the conductive unit 51 has a plate configuration extending in the X-direction and the Z-direction. The insulating unit 52 is provided between the conductive unit 51 and the stacked body ML. The second interconnect member LI2 includes the conductive unit 53 and the insulating unit 54. For example, the conductive unit 53 has a plate configuration extending in the X-direction and the Z-direction. The insulating unit 54 is provided between the conductive unit 53 and the stacked body ML.

FIG. 21A to FIG. 21D are cross-sectional views showing the semiconductor memory device according to the embodiment.

FIG. 21 is a cross-sectional view showing a cross section along line C-C' shown in FIG. 20A; FIG. 21B is a cross-sectional view showing a cross section along line D-D' shown in FIG. 20; FIG. 21C is a cross-sectional view showing a cross section along line E-E' shown in FIG. 20; and FIG. 21D is a cross-sectional view showing a cross section along line F-F' shown in FIG. 20.

As shown in FIG. 21A, FIG. 21B, FIG. 21C, and FIG. 21D, the multiple insulating layers 31 are provided between the two insulating films HR adjacent to each other in the Y-direction.

Figure 21A:
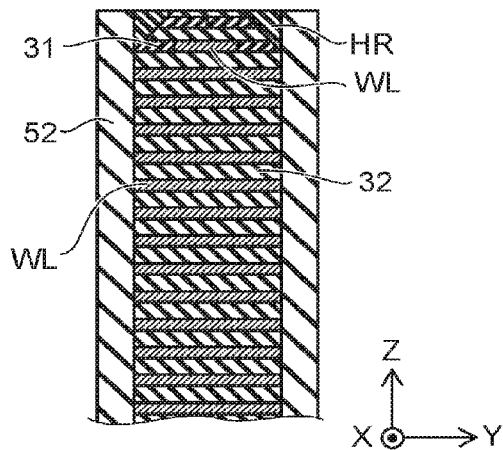
FIG. 21A to FIG. 21D are cross-sectional views showing the semiconductor memory device according to the second embodiment.

As shown in FIG. 21A, in the cross section along line C-C' shown in FIG. 20, the insulating layers 31 of the second layer from the uppermost layer of the stacked body ML are provided as one continuous insulating layer. In this cross section, two insulating layers 31 are provided to be separated from each other in the fourth layer from the uppermost layer of the stacked body ML. One portion of the conductive layer WL is disposed between the two insulating layers 31.

Figure 21B:
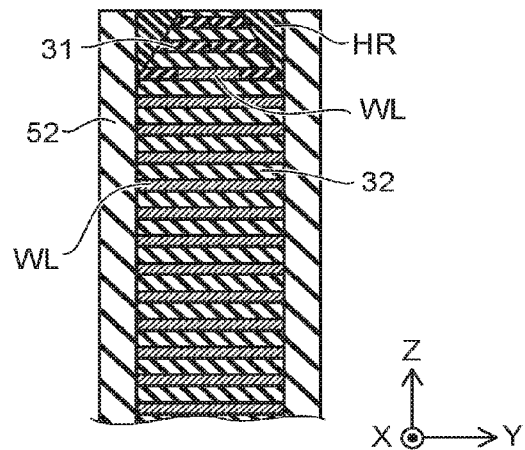

As shown in FIG. 21B, in the cross section along line D-D' shown in FIG. 20, the insulating layers 31 of the second layer and the fourth layer from the uppermost layer of the stacked body ML are provided as one continuous insulating layer. In this cross section, two insulating layers 31 are disposed to be separated from each other in the sixth layer from the uppermost layer of the stacked body ML. One portion of the conductive layer WL is disposed between the two insulating layers 31.

Figure 21C:
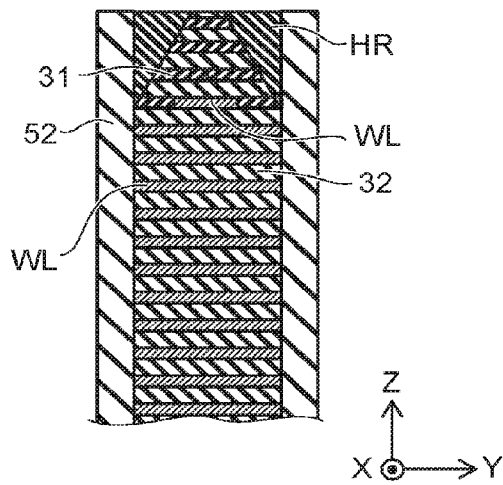

As shown in FIG. 21C, in the cross section along line E-E' shown in FIG. 20, the insulating layers 31 of each of the second layer, the fourth layer, and the sixth layer from the uppermost layer of the stacked body ML are provided as one continuous insulating layer between the insulating films HR. Two insulating layers 31 are disposed to be separated from each other in the eighth layer from the uppermost layer of the stacked body ML. The conductive layer WL is disposed between the two insulating layers 31.

The cross section along line F-F' shown in FIG. 20 corresponds to the cross section of the terrace region TR one level down from the uppermost layer of the stacked body ML.

Figure 21D:
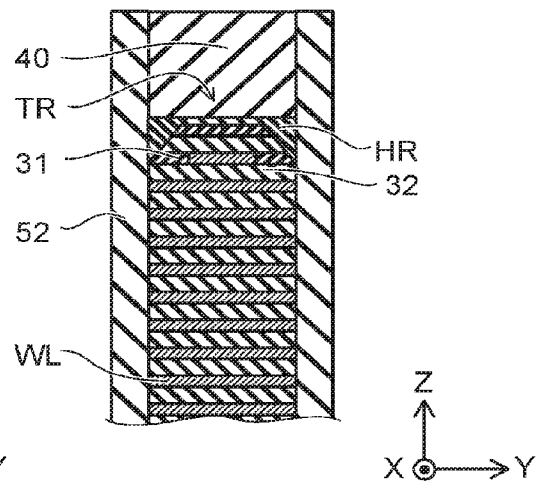

As shown in FIG. 21D, in the cross section along line F-F' shown in FIG. 20, one continuous insulating layer 31 is provided in the second layer from the uppermost layer of the terrace region TR. Two insulating layers 31 are provided to be separated from each other in the fourth layer from the uppermost layer of the terrace region TR. The conductive layer WL is disposed between the two insulating layers 31.

As shown in FIG. 19, one contact plug CP is electrically connected to one of the conductive layers WL extending to be continuous from the memory region MR and passes through the sub-conductive layers WX provided on the conductive layer WL. Thereby, a prescribed contact plug CP is electrically connected to a prescribed one of the conductive layers WL extending to be continuous from the memory region MR.

However, among the conductive layers WL extending to be continuous from the memory region MR, the contact plug CP that is connected to the conductive layer WL of the uppermost layer for each of the terrace regions TR does not pass through the sub-conductive layers WX.

A method for manufacturing the semiconductor memory device according to the embodiment will now be described.

FIG. 22A to FIG. 28B are views of processes, showing the method for manufacturing the semiconductor memory device according to the embodiment.

Figure 22A:
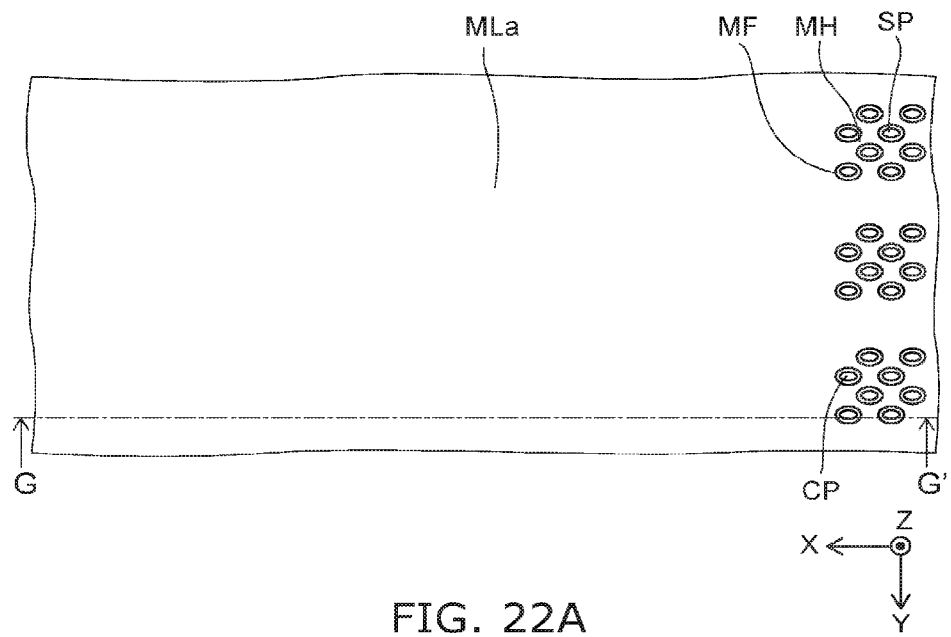
FIG. 22A to FIG. 28B are views of processes, showing the method for manufacturing the semiconductor memory device according to the second embodiment.
Figure 22B:
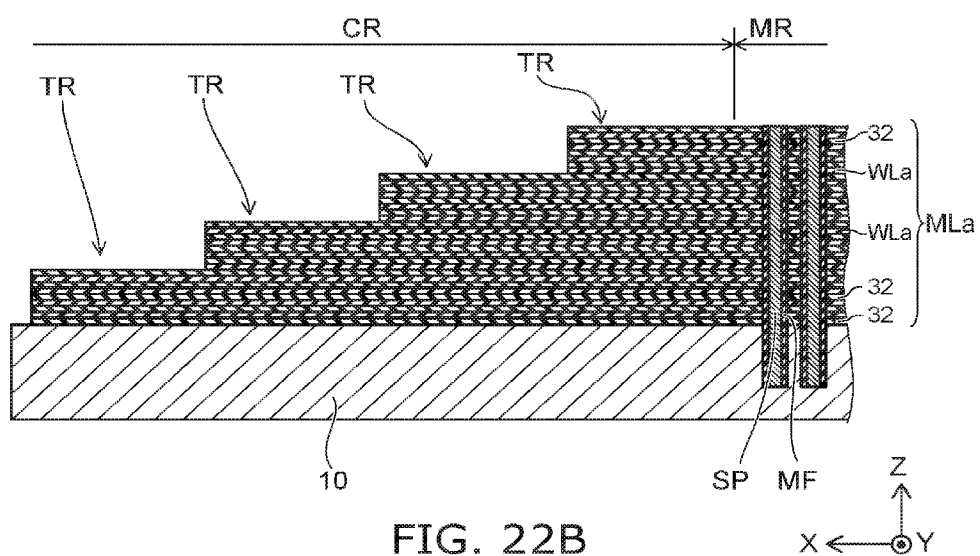

FIG. 22A is a plan view showing the method for manufacturing the semiconductor memory device; and FIG. 22B is a cross-sectional view showing a cross section along line G-G' shown in FIG. 22A.

Figure 23A:
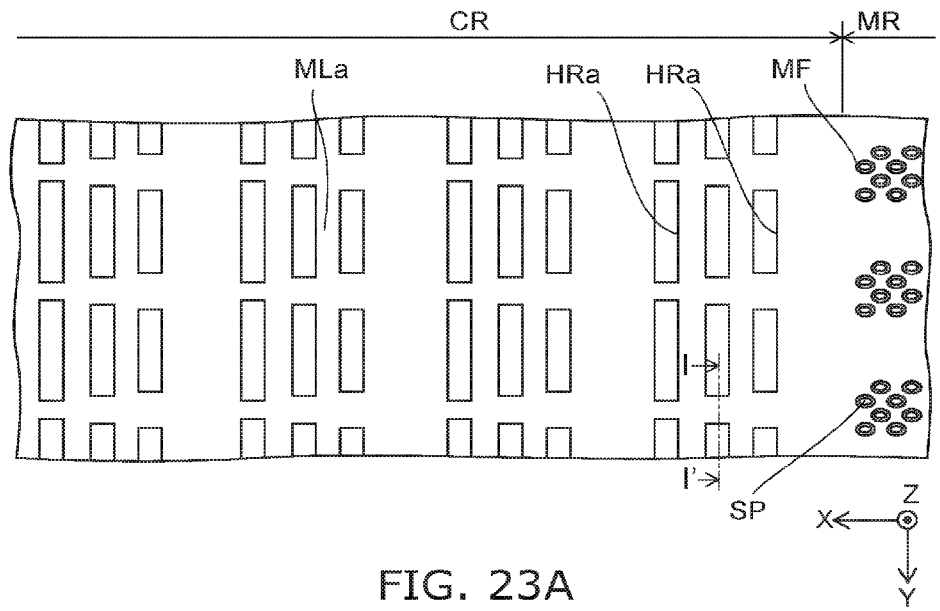
Figure 23B:
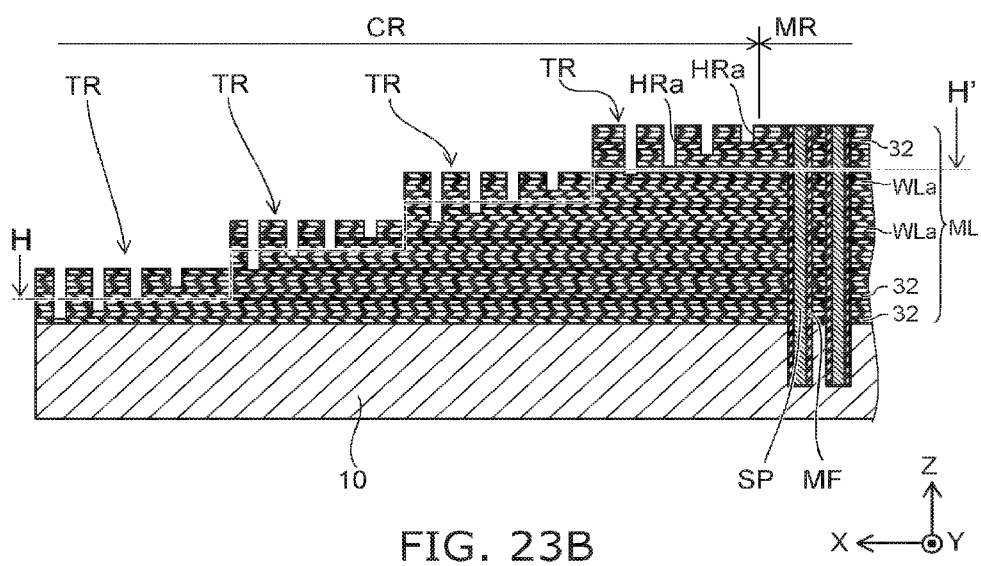
Figure 24A:
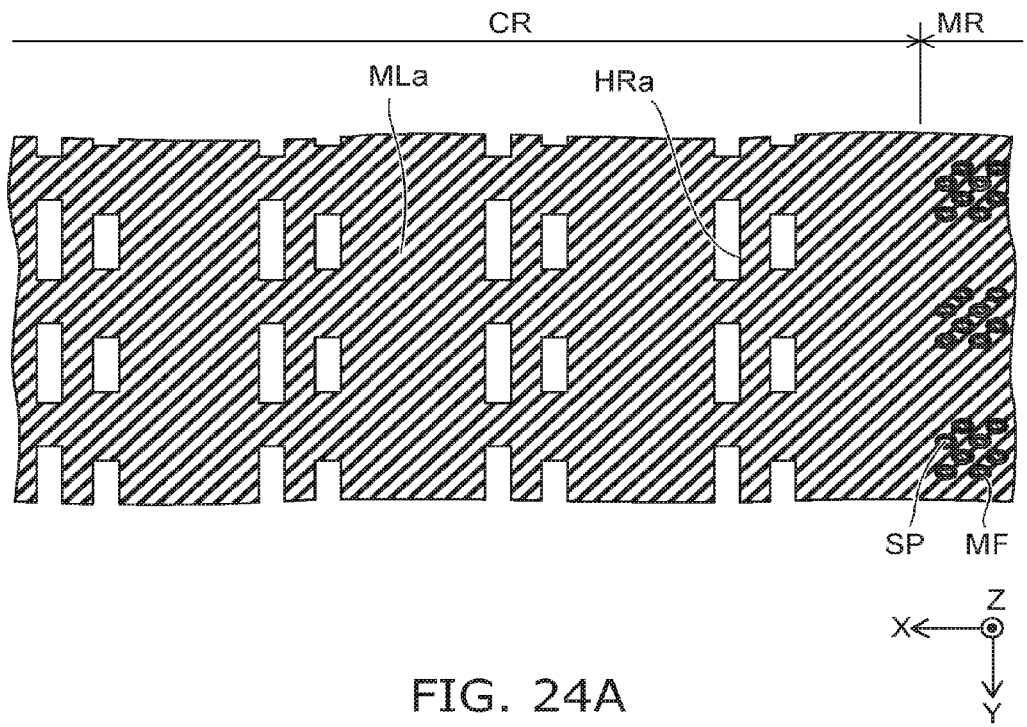
Figure 24B:
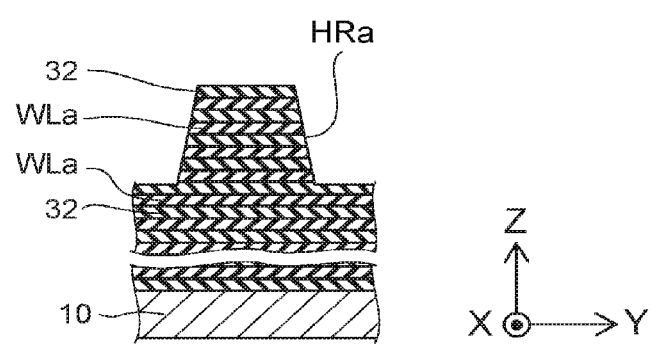

FIG. 23A is a plan view showing the method for manufacturing the semiconductor memory device; FIG. 23B is a cross-sectional view showing a cross section corresponding to the cross section along line G-G' shown in FIG. 22A; FIG. 24A is a cross-sectional view showing a cross section corresponding to a cross section along line H-H' shown in FIG. 23B; and FIG. 24B is a cross-sectional view showing a cross section corresponding to a cross section along line I-I' shown in FIG. 23A.

Figure 25A:
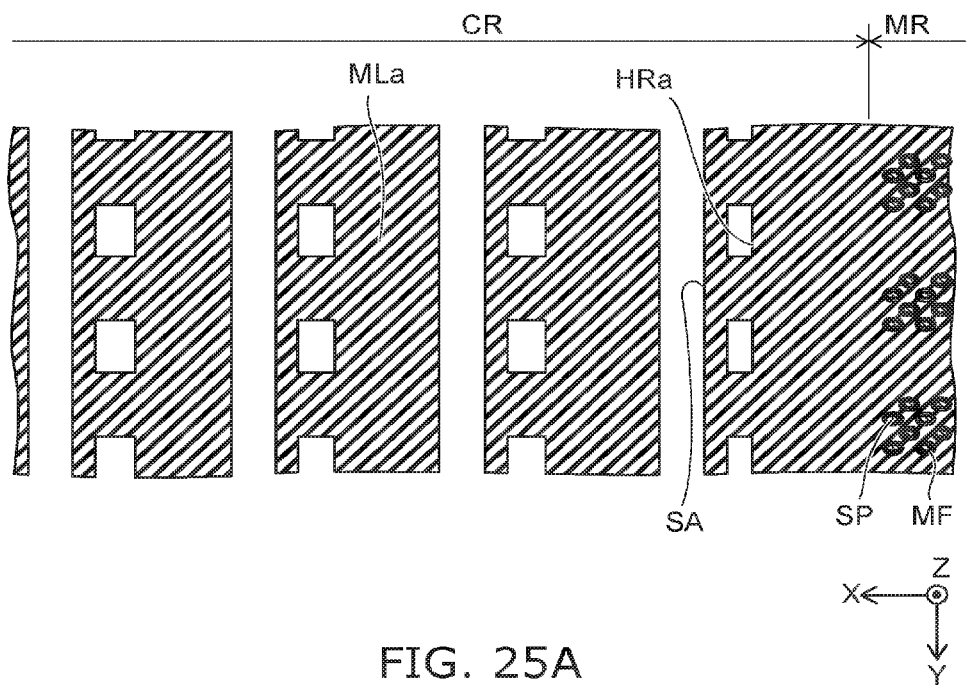
Figure 25B:
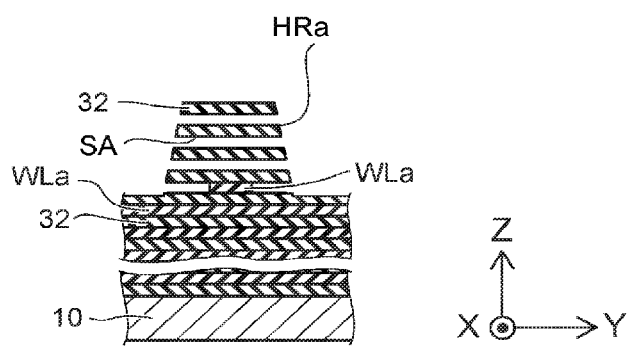

FIG. 25A is a cross-sectional view of a cross section corresponding to the cross section along line H-H' shown in FIG. 23B; and FIG. 25B is a cross-sectional view showing a cross section corresponding to the cross section along line I-I' shown in FIG. 23A.

Figure 26:
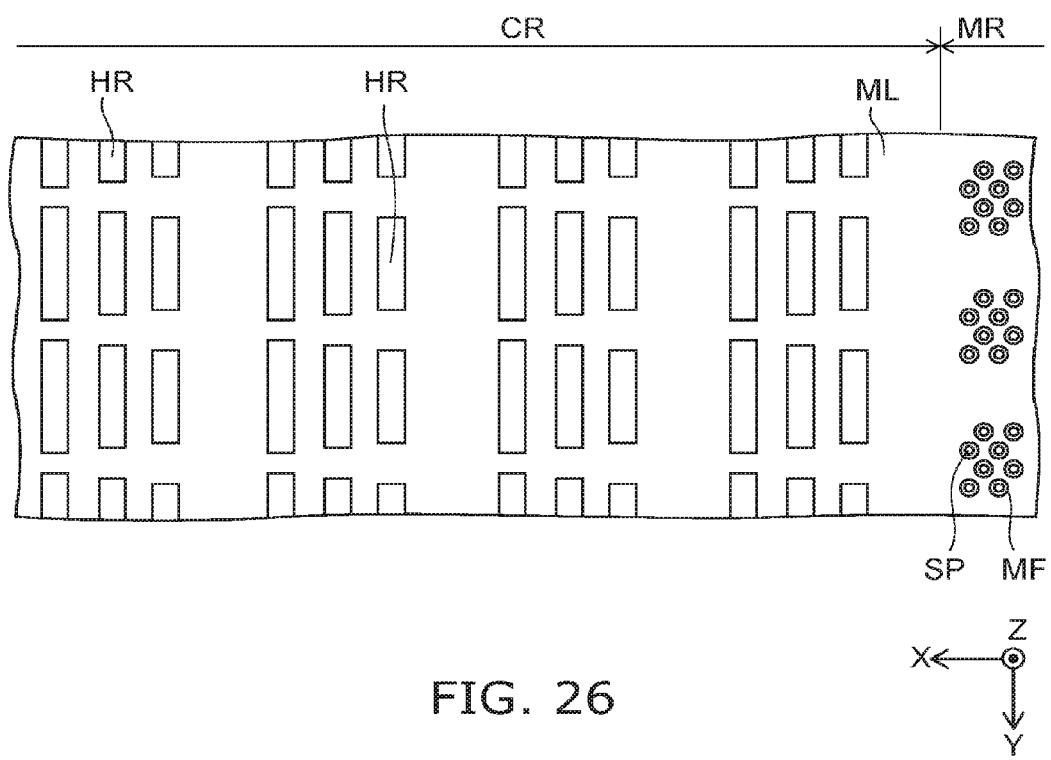
Figure 27A:
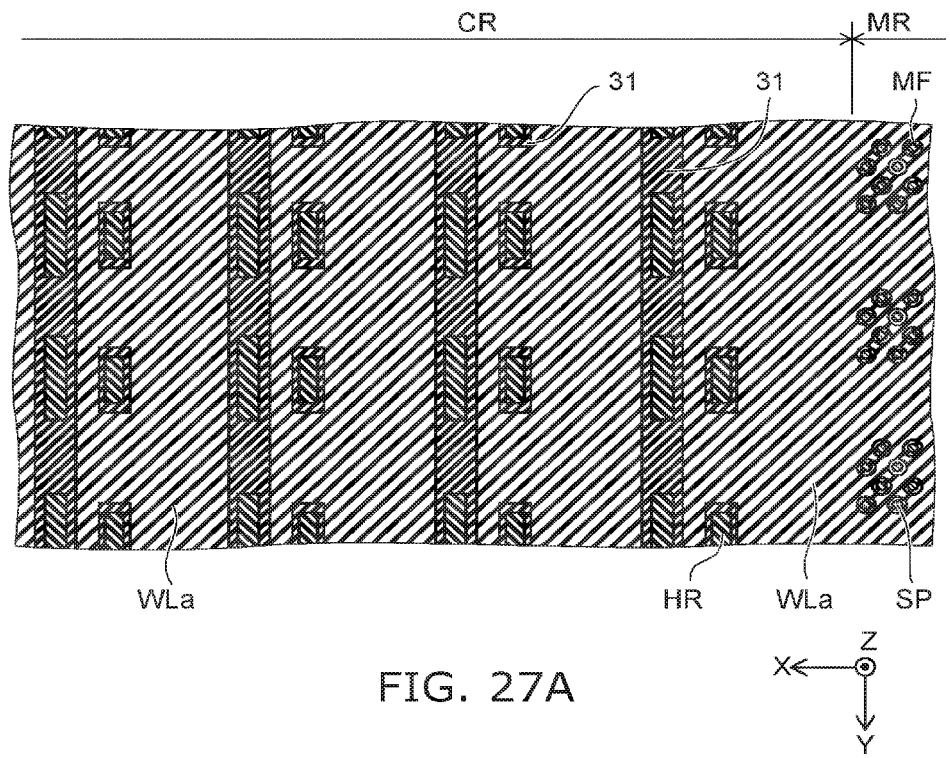
Figure 27B:
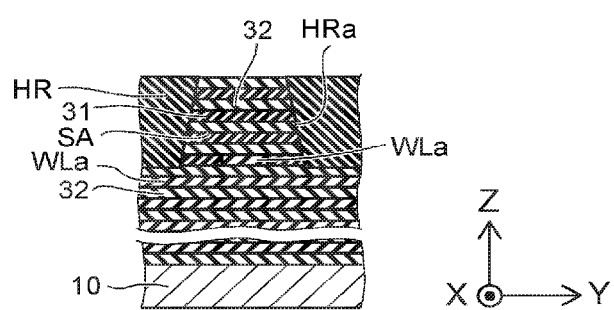

FIG. 26 is a plan view showing the method for manufacturing the semiconductor memory device; FIG. 27A is a cross-sectional view showing a cross section corresponding to the cross section along line H-H' shown in FIG. 23B; and FIG. 27B is a cross-sectional view showing a cross section corresponding to the cross section along line I-I' shown in FIG. 23A.

Figure 28A:
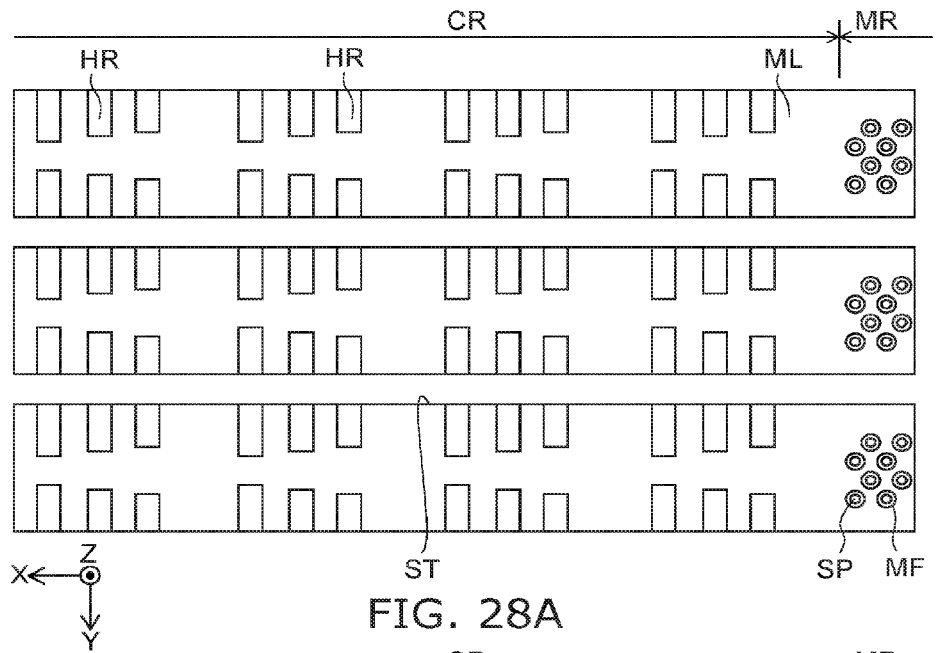
Figure 28B:
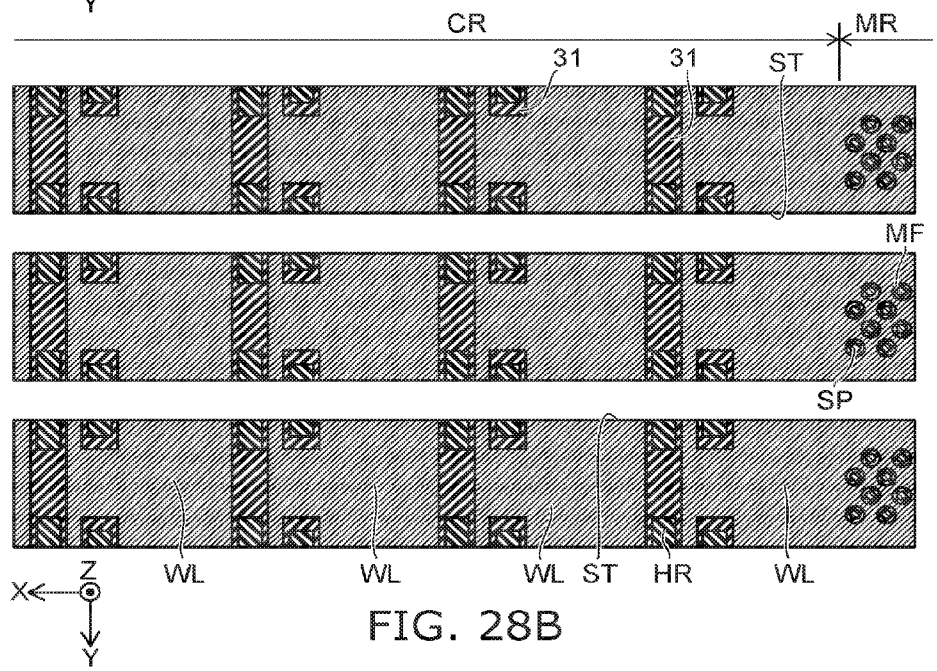

FIG. 28A is a plan view showing the method for manufacturing the semiconductor memory device; and FIG. 28B is a cross-sectional view showing a cross section corresponding to the cross section along line H-H' shown in FIG. 23B.

As shown in FIG. 22A and FIG. 22B, the stacked body MLa that includes the multiple sacrificial layers WLa is formed on the foundation layer 10. The sacrificial layers WLa are formed to be separated from each other in the Z-direction. For example, the stacked body MLa is formed by alternately stacking the multiple sacrificial layers WLa and the multiple inter-electrode insulating layers 32. For example, the sacrificial layers WLa are formed using a material including silicon nitride. For example, the inter-electrode insulating layers 32 are formed of a material including silicon oxide. The multiple memory holes MH that pierce the stacked body MLa are made in the memory region MR.

As shown in FIG. 22A, the memory film MF is formed on the side surfaces of the memory holes MH. For example, the memory film MF is formed by stacking a blocking insulating film, a charge storage film, and a tunneling insulating film in this order. The semiconductor pillars SP are formed inside the memory holes MH. The semiconductor pillars SP are electrically connected to the foundation layer 10 (the semiconductor substrate).

Subsequently, as shown in FIG. 22B, stepped portions are formed in the stacked body MLa in the connection region CR. Thereby, the stacked body MLa is patterned into a stairstep configuration in the connection region CR.

In the connection region CR, for example, a stepped portion is formed in the stacked body MLa every eight layers. For example, a stepped portion is formed in the stacked body MLa every four layers or more.

As shown in FIG. 23A and FIG. 23B, the multiple trenches HRa are made in the terrace regions TR. For example, the trenches HRa are made by patterning technology such as photolithography, etc. For example, in each of the terrace regions TR, the trenches HRa are made to be larger away from the memory region MR.

As shown in FIG. 24A, two trenches HRa reach the sacrificial layer WLa of the fourth layer from the uppermost layer of the stacked body MLa for every terrace region TR.

As shown in FIG. 24B, the configuration of the trench HRa is, for example, a substantially trapezoidal configuration. The length of the trench HRa in a direction (e.g., the Y-direction) orthogonal to the Z-direction decreases toward the bottom of the trench HRa. For example, the side surface of the trench HRa is tilted.

Wet etching is performed via the trenches HRa. Thereby, one portion of the sacrificial layers WLa is removed. Thereby, as shown in FIG. 25A, the hollow portions SA are made in the region inside the stacked body MLa where the sacrificial layers WLa were removed. Thereby, one portion of the multiple trenches HRa adjacent to each other in the Y-direction communicates with each other. At this time, as shown in FIG. 25B, for example, in the cross section corresponding to the cross section along line I-I' shown in FIG. 23A, one portion of the sacrificial layers WLa up to the eighth layer from the uppermost layer of the stacked body MLa is removed. Up to the sixth layer from the uppermost layer of the stacked body MLa, the trenches HRa that are adjacent to each other in the Y-direction communicate with each other. In the eighth layer from the uppermost layer, the sacrificial layer WLa remains between the trenches HRa adjacent to each other in the Y-direction.

The two trenches HRa adjacent to each other in the Y-direction in one terrace region TR are taken as one set of trenches HRa. For example, in one terrace region TR, one set of trenches HRa most proximal to the memory region MR communicates with each other via the hollow portion SA made in the second layer from the uppermost layer of the terrace region TR in the stacked body MLa. In one terrace region TR, one set of trenches HRa second most proximal to the memory region MR communicates with each other via the hollow portions SA made in the second layer and the fourth layer from the uppermost layer of the terrace region TR in the stacked body MLa. In one terrace region TR, one set of trenches HRa third most proximal to the memory region MR communicates with each other via the hollow portions SA made in the second layer, the fourth layer, and the sixth layer from the uppermost layer of the terrace region TR in the stacked body MLa.

For example, patterning such as that described above is performed for each of the terrace regions TR. The sacrificial layers WLa that are formed continuously from the memory region MR are divided by the portion where the trenches HRa communicate with each other. Accordingly, the position where the sacrificial layer WLa is divided is more proximal to the memory region MR toward the upper layer of the stacked body MLa.

As shown in FIG. 26, an insulating material is provided inside the trenches HRa and the hollow portions SA. Thereby, the insulating films HR are formed inside the trenches HRa. As shown in FIG. 27A, the insulating layers 31 are formed inside the hollow portions SA.

As shown in FIG. 28A, the multiple slits ST are made in the stacked body ML and the insulating films HR. The slits ST divide the stacked body ML and the insulating films HR in the Y-direction. Although not shown, the upper surface of the foundation layer 10 (the semiconductor substrate) is exposed at the bottoms of the slits ST.

Wet etching of the sacrificial layers WLa is performed via the slits ST. Thereby, the sacrificial layers WLa are removed. As shown in FIG. 28B, for example, a conductive material such as tungsten or the like is provided in the space where the sacrificial layers WLa were removed. Thereby, the conductive layers WL are formed.

Subsequently, as shown in FIG. 20, the insulating units (52 and 54) are formed on the side walls of the slits ST. Subsequently, a conductive material is provided inside the slits ST. Thereby, the conductive units (51 and 53) are formed inside the slits ST. The conductive units 51 and 53 are electrically connected to the foundation layer 10 (the semiconductor substrate). Thereby, the multiple interconnect members LI are formed.

The multiple contact plugs CP are formed on each of the terrace regions TR. For example, the contact plugs CP are formed by implementing processes similar to those of the method for forming the contact plugs of the first embodiment.

The semiconductor memory device 200 according to the embodiment is manufactured by the processes recited above.

For example, the method for manufacturing the semiconductor memory device 200 according to the embodiment includes a process of forming the stacked body MLa that includes the multiple first layers (e.g., the sacrificial layers WLa) arranged to be separated from each other in the first direction (the Z-direction), a process of forming the terrace regions TR by forming stepped portions in the stacked body MLa, a process of forming the trenches HRa in the terrace regions TR, a process of making the hollow portions SA inside the stacked body MLa by etching one portion of the first layers (e.g., the sacrificial layers WLa) via the trenches HRa, an insulating layer formation process of providing an insulating material inside the trenches HRa and inside the hollow portions SA, a slit formation process of making the slits ST in the stacked body MLa, an etching process of removing the other portions of the first layers by performing etching via the slits ST, and a conductive layer formation process of providing a conductive material in the region where the first layers are removed.

The method for manufacturing the semiconductor memory device 200 according to the embodiment may further include, after the insulating layer formation process and prior to the slit formation process, a process of making the contact holes CH in the terrace regions TR, and a process of providing first members (e.g., the sacrificial members CPa) inside the contact holes CH. The first members are removed in the etching process. The conductive material is provided inside the contact holes CH in the conductive layer formation process.

An example of a layout of the stepped portions will now be described.

Figure 29:
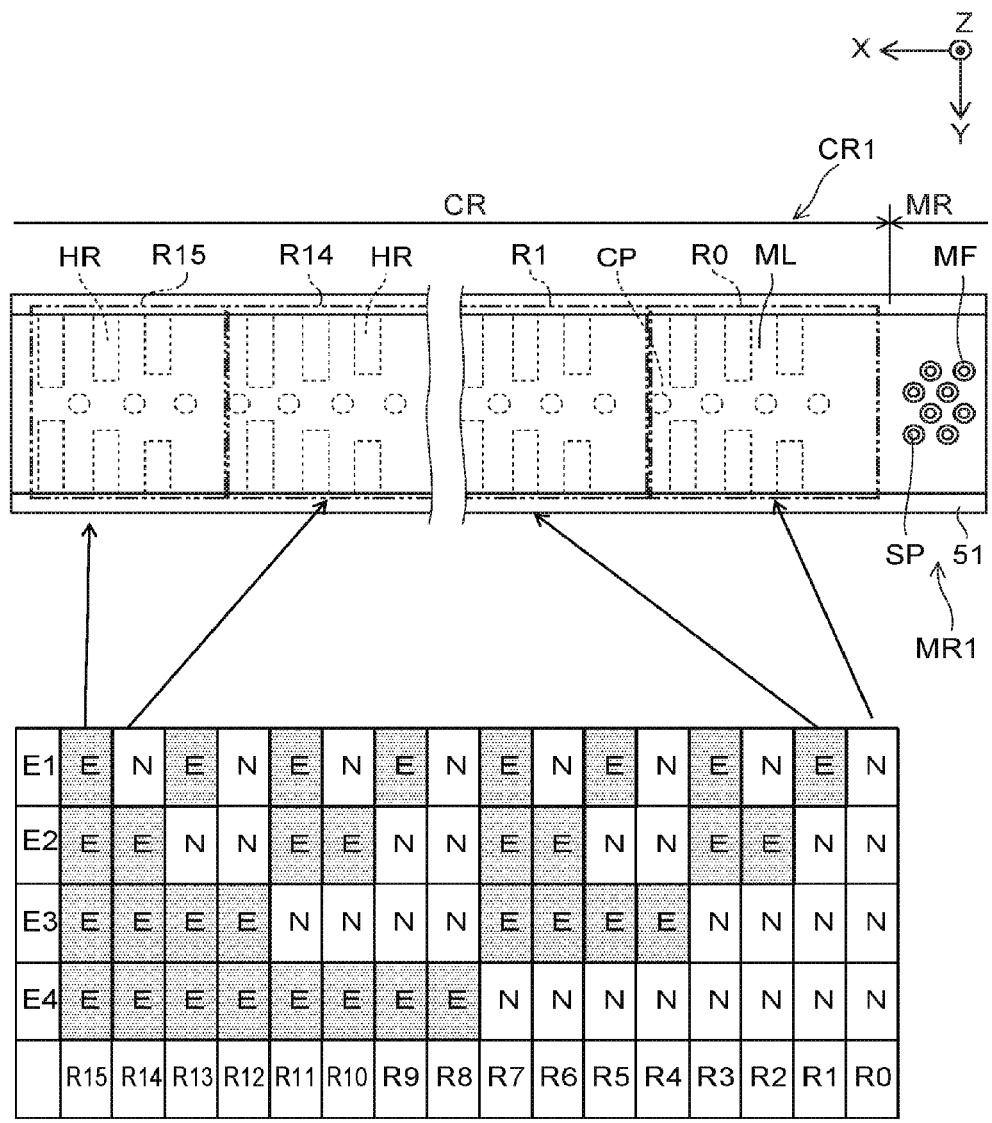
FIG. 29 is a drawing showing the example of the layout of the stepped portions of the semiconductor memory device according to the second embodiment.

FIG. 29 is a drawing showing the example of the layout of the stepped portions of the semiconductor memory device according to the second embodiment.

In the example, a stacked body ML in which the number of layers is 65 layers is described as an example. In such a case, the stacked body ML includes 32 layers of conductive layers WL and 33 layers of inter-electrode insulating layers 32. The inter-electrode insulating layers 32 are disposed in the odd layers from the uppermost layer of the stacked body ML. The conductive layers WL and the insulating layers 31 are disposed in the even layers from the uppermost layer of the stacked body ML.

For the description as shown in FIG. 29, regions R0 to R15 are set in the connection region CR. The regions R0 to R15 are set in this order along the X-direction. In other words, the regions R0 to R15 are set in the order of, from most proximal to the memory region MR to most distal, the region R0, the region R1, the region R2, the region R3, . . . , the region R15.

Case E1 is the case where a stepped portion is formed in the stacked body ML every four layers.

In such a case, a stepped portion is provided between the region R1 and the region R2, between the region R3 and the region R4, between the region R5 and the region R6, between the region R7 and the region R8, between the region R9 and the region R10, between the region R11 and the region R12, and between the region R13 and the region R14.

In case E1, eight insulating films HR are provided in each of the regions illustrated by "E" in the table of FIG. 29. The insulating film HR is not formed in the regions illustrated by "N" in the table of FIG. 29. In other words, eight insulating films HR are provided in each of the region R1, the region R3, the region R5, the region R7, the region R9, the region R11, the region R13, and the region R15. Two insulating films HR that are arranged in the Y-direction of the eight insulating films HR are taken as one set. Four sets of insulating films HR are arranged along the X-direction. For example, the four sets of insulating films HR are smaller toward the memory region MR.

Case E2 is the case where a stepped portion is formed every eight layers in the stacked body ML.

In such a case, a stepped portion is provided between the region R3 and the region R4, between the region R7 and the region R8, and between the region R11 and the region R12.

In case E2, eight insulating films HR are provided in each of the regions illustrated by "E" in the table of FIG. 29. In other words, eight insulating films HR are provided in each of the region R2, the region R3, the region R6, the region R7, the region R10, the region R11, the region R14, and R15. Two insulating films HR that are arranged in the Y-direction of the eight insulating films HR are taken as one set. Four sets of insulating films HR are arranged along the X-direction. For example, the four sets of insulating films HR are smaller toward the memory region MR.

Case E3 is the case where a stepped portion is formed every sixteen layers in the stacked body ML.

In such a case, a stepped portion is provided between the region R3 and the region R4, between the region R7 and the region R8, and between the region R11 and the region R12.

In case E3, eight insulating films HR are provided in each of the regions illustrated by "E" in the table of FIG. 29. In other words, eight insulating films HR are provided in each of the regions R4 to R7 and the regions R12 to R15. Two insulating films HR that are arranged in the Y-direction of the eight insulating films HR are taken as one set. Four sets of insulating films HR are arranged along the X-direction. For example, the four sets of insulating films HR are smaller toward the memory region MR.

Case E4 is the case where a stepped portion is formed every thirty-two layers in the stacked body ML.

In such a case, a stepped portion is provided between the region R7 and the region R8.

In case E4, eight insulating films HR are provided in each of the regions illustrated by "E" in the table of FIG. 29. In other words, eight insulating films HR are provided in each of the regions R8 to R15. Two insulating films HR that are arranged in the Y-direction of the eight insulating films HR are taken as one set. Four sets of insulating films HR are arranged along the X-direction. For example, the four sets of insulating films HR are smaller toward the memory region MR.

The layout described above is an example; and the layout of the invention is not limited thereto.

In the embodiments, for example, a stepped portion is formed in the stacked body ML every four layers or more (e.g., every eight layers). Accordingly, the number of stepped portions formed in the stacked body ML is less than the case where the stepped portion is formed every two layers. Subsequently, the insulating films HR and the insulating layers 31 are formed. The conductive layer WL that is electrically connected to the contact plug CP is determined by the sizes and configurations of the insulating films HR. Thereby, compared to the case where the stepped portion is formed every two layers, the processes of forming the stepped portions in the stacked body ML are reduced.

If planarization such as CMP or the like is implemented after the stepped portion formation, there are cases where a concavity occurs at the vicinity of the stepped portions. In the embodiments, the occurrence of the concavity or the like can be suppressed compared to the case where the stepped portion is formed every two layers because the number of stepped portions is low. Thereby, the yield when forming the interconnects, etc., on the stacked body ML increases. Accordingly, the process cost decreases.

A third embodiment will now be described.

Figure 30:
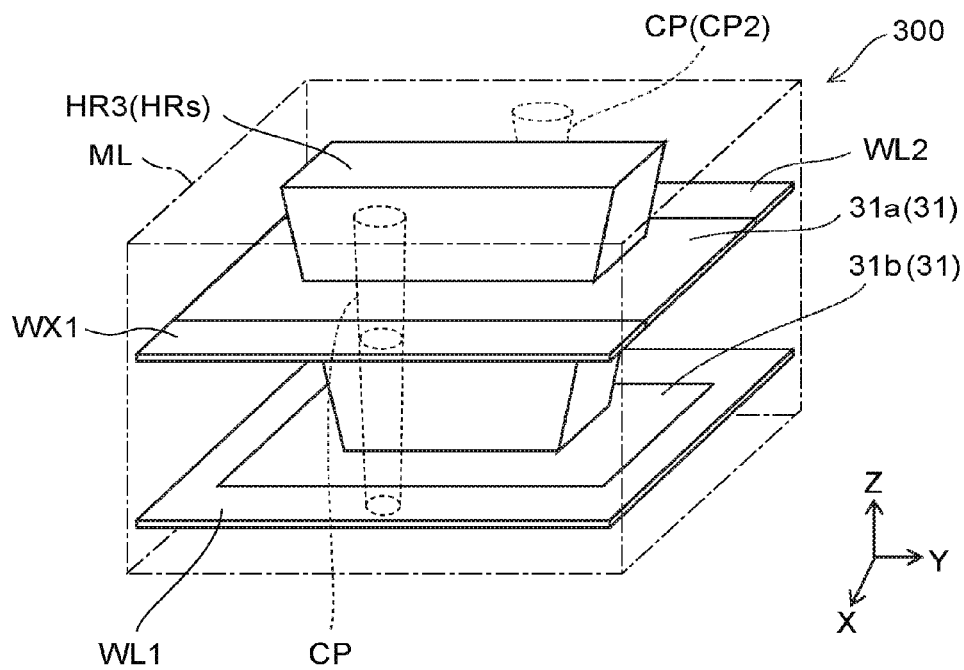
FIG. 30 is a perspective view showing one portion of a semiconductor memory device according to a third embodiment.

FIG. 30 is a perspective view showing one portion of a semiconductor memory device according to the embodiment.

FIG. 30 is a perspective view showing a region corresponding to the region RE1 shown in FIG. 1A.

In the semiconductor memory device 300 according to the modification as shown in FIG. 30, the configuration of the insulating film HR is different from that of the semiconductor memory device 100.

In the embodiment, an insulating film HRs is provided at the Y-direction central region vicinity in the connection region CR. That is, instead of two insulating films HR adjacent to each other in the Y-direction, one insulating film HRs is provided in the semiconductor memory device 100. Multiple insulating films HRs are provided in the semiconductor memory device 300 similarly to the multiple insulating films HR being provided in the semiconductor memory device 100. The multiple insulating films HRs include, for example, an insulating film HR3.

One portion of the insulating film HR3 overlaps one portion of the first insulating layer 31a in directions (e.g., the X-direction and the Y-direction) orthogonal to the Z-direction. The one portion of the insulating film HR3 overlaps the first sub-conductive layer WX1 and the first conductive layer WL1 in the X-direction. The first insulating layer 31a is disposed between the first sub-conductive layer WX1 and the one portion of the insulating film HR3 and between the second conductive layer WL2 and the one portion of the insulating film HR3. The first conductive layer WL1 overlaps one other portion of the insulating film HR3 in directions (e.g., the X-direction and the Y-direction) orthogonal to the Z-direction. The second insulating layer 31b is provided between the first conductive layer WL1 and the one other portion of the insulating film HR3.

Other than the configurations of the insulating films HRs and the configurations of the insulating layers 31 being different from those of the insulating films HR and the insulating layers 31 of the semiconductor memory device 100, the semiconductor memory device 300 according to the embodiment is similar to the first embodiment described above.

The insulating films HRs and the insulating layers 31 are provided in the embodiment. The conductive layer WL that is electrically connected to the contact plug CP is determined by the sizes and configurations of the insulating layers 31 and the insulating films HRs. Thereby, similarly to the first embodiment, the contact plug CP can be electrically connected to one of the conductive layers WL provided to be continuous from the prescribed memory region MR without forming stepped portions in the stacked body ML. Thereby, the processes of forming the stepped portions in the stacked body ML can be reduced.

Because a stepped portion is not formed in the stacked body ML, the occurrence of a concavity, etc., can be suppressed. Thereby, the yield when forming the interconnects, etc., on the stacked body ML increases. Accordingly, the process cost decreases.

A fourth embodiment will now be described.

Figure 31:
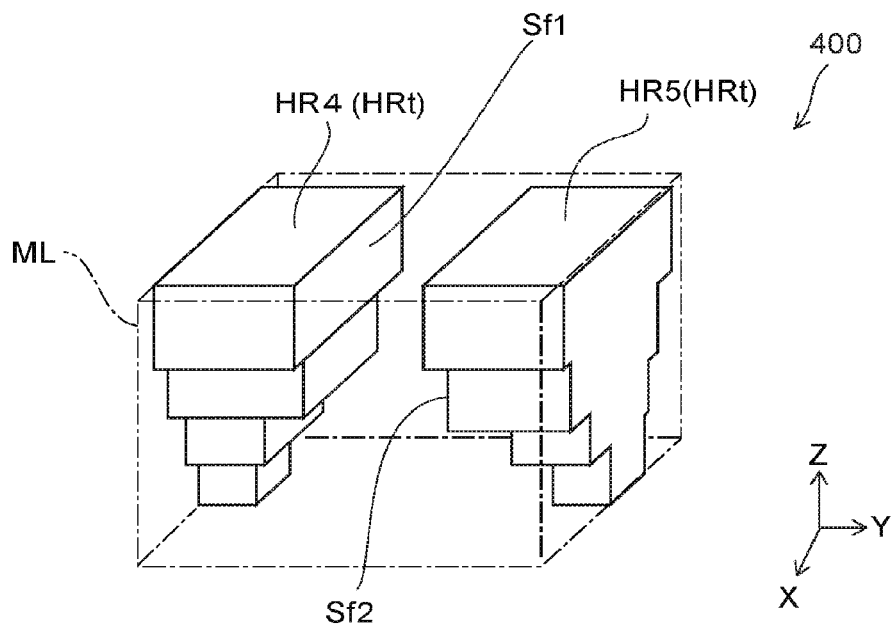
FIG. 31 is a perspective view showing one portion of a semiconductor memory device according to the fourth embodiment.

FIG. 31 is a perspective view showing one portion of a semiconductor memory device according to the embodiment.

Figure 32A:
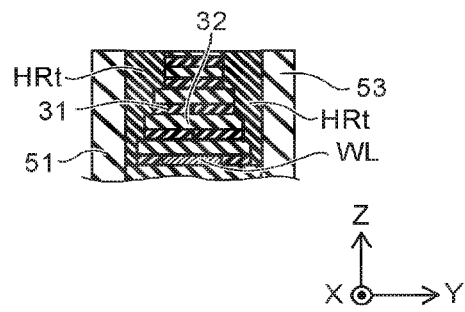
FIG. 32A and FIG. 32B are cross-sectional views showing the semiconductor memory device according to the fourth embodiment.
Figure 32B:
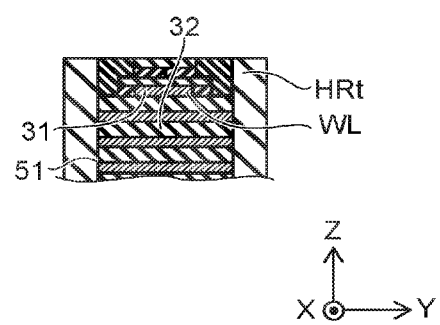

FIG. 32A and FIG. 32B are cross-sectional views showing the semiconductor memory device according to the embodiment.

FIG. 31 is a perspective view showing a region corresponding to the region RE1 shown in FIG. 1A. FIG. 32A is a cross-sectional view showing a cross section corresponding to a cross section along line N1-N1' shown in FIG. 1A; and FIG. 32B is a cross-sectional view showing a cross section corresponding to a cross section along line N2-N2' shown in FIG. 1.

In the semiconductor memory device 400 according to the embodiment as shown in FIG. 31, multiple insulating films HRt are provided instead of the multiple insulating films HR of the semiconductor memory device 100. The configurations of the insulating films HRt are different from those of the insulating films HR of the semiconductor memory device 100.

For the configurations of the insulating films HRt, an example of the insulating films HRt provided in the region corresponding to the region RE1 shown in FIG. 1A is described.

The multiple insulating films HRt include, for example, a fourth insulating film HR4 and a fifth insulating film HR5. The fourth insulating film HR4 and the fifth insulating film HR5 are provided in the region corresponding to the region RE1 shown in FIG. 1A. For example, the fourth insulating film HR4 and the fifth insulating film HR5 are arranged to be separated from each other in the Y-direction. In the Y-direction, at least one portion of the fourth insulating film HR4 overlaps at least one portion of the fifth insulating film HR5. The fourth insulating film HR4 has the first surface Sf1. The fifth insulating film HR5 has the second surface Sf2. The first surface Sf1 and the second surface Sf2 oppose each other.

The portion of the fourth insulating film HR4 having the first surface Sf1 has an inverted stairstep configuration. The portion of the fifth insulating film HR5 having the second surface Sf2 has an inverted stairstep configuration. An inverted stairstep configuration means a configuration in which a region at a constant height is recessed from the upper end side of the region and has a difference in levels with respect to the upper end side of the region. The side surfaces in the X-direction of the fourth insulating film HR4 and the fifth insulating film HR5 also may have inverted stairstep configurations.

As shown in FIG. 32A, in the cross section corresponding to the cross section along line N1-N1' shown in FIG. 1A, the insulating layers 31 of each of the second layer, the fourth layer, and the sixth layer from the uppermost layer of the stacked body ML are provided as one continuous insulating layer 31 between two insulating films HRt. The insulating layers 31 of the tenth layer from the uppermost layer of the stacked body ML are disposed to be divided into two portions. The conductive layer WL is disposed between the two insulating layers 31.

In one terrace region TR, the size of the insulating film HRt decreases as the position where the insulating film HRt is provided becomes more proximal to the memory region MR. The number of stepped portions also decreases as the insulating film HRt is provided at a position more proximal to the memory region MR.

For example, as shown in FIG. 32B, the insulating film HRt includes one stepped portion at a location corresponding to the cross section along line N2-N2' shown in FIG. 1A.

The insulating layers 31 of the second layer from the uppermost layer of the stacked body ML are provided as one continuous insulating layer between two insulating films HRt. Two insulating layers 31 of the fourth layer from the uppermost layer of the stacked body ML are disposed to be separated from each other. The conductive layer WL is disposed between the two insulating layers 31.

The insulating films HRt are formed by providing an insulating material such as silicon oxide, etc., inside trenches including stepped portions formed in the stacked body MLa. For example, the trenches that include the stepped portions are formed by slimming. Other than the insulating films HRt being provided instead of the insulating films HR, the semiconductor memory device is similar to the semiconductor memory device 100.

An example of the configuration of the semiconductor pillar and the periphery of the semiconductor pillar of the embodiments will now be described.

Figure 33A:
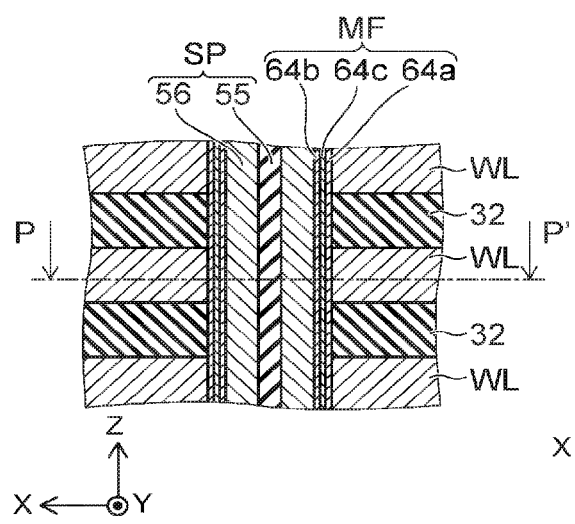
FIG. 33A and FIG. 33B are schematic views showing the semiconductor pillar and the periphery of the semiconductor pillar of the embodiments.
Figure 33B:
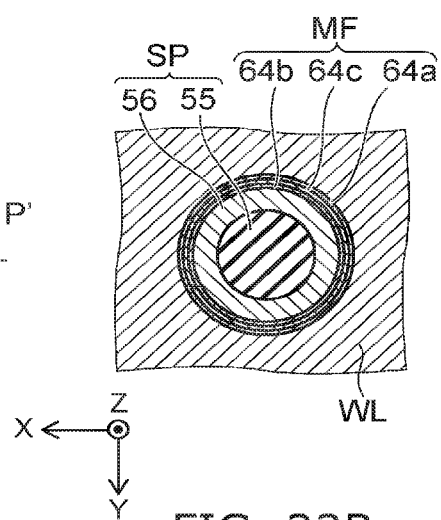

FIG. 33A and FIG. 33B are schematic views showing the semiconductor pillar and the periphery of the semiconductor pillar.

FIG. 33B is a cross-sectional view along line P-P' shown in FIG. 33A.

As shown in FIG. 33A, the semiconductor pillar SP includes, for example, a semiconductor film 56 and a core insulating film 55. For example, the core insulating film 55 extends in the Z-direction. As shown in FIG. 33B, the semiconductor film 56 is provided between the core insulating film 55 and the memory film MF.

The memory film MF includes, for example, a blocking insulating film 64a, a charge storage film 64b, and a tunneling insulating film 64c. The blocking insulating film 64a is provided between the stacked body ML and the semiconductor pillar SP. The tunneling insulating film 64c is provided between the blocking insulating film 64a and the semiconductor pillar SP. The charge storage film 64b is provided between the blocking insulating film 64a and the tunneling insulating film 64c.

The blocking insulating film 64a is a film in which a current substantially does not flow even when a voltage within the range of the drive voltage of the semiconductor memory device 100 is applied. The charge storage film 64b is a film that can retain charge. Although the tunneling insulating film 64c normally is insulative, the tunneling insulating film 64c is a film in which a tunneling current flows when a prescribed voltage within the range of the drive voltage of the semiconductor memory device 100 is applied.

The blocking insulating film 64a and the tunneling insulating film 64c include, for example, silicon oxide. The blocking insulating film 64a and the tunneling insulating film 64c may include, for example, at least one of $Al_2O_3$, $Y_2O_3$, $La_2O_3$, $Gd_2O_3$, $Ce_2O_3$, $CeO_2$, $Ta_2O_5$, $HfO_2$, $ZrO_2$, $TiO_2$, HfSiO, HfAlO, ZrSiO, ZrAlO, or AlSiO. The charge storage film 64b includes, for example, silicon nitride. The charge storage film 64b may be a floating electrode surrounded with an insulator.

According to the embodiments described above, a semiconductor memory device and a method for manufacturing the semiconductor memory device having higher productivity can be realized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. Additionally, the embodiments described above can be combined mutually.

What is claimed is:

1. A semiconductor memory device, comprising:
   a first conductive layer;
   a second conductive layer provided to be separated from the first conductive layer in a first direction;
   a first sub-conductive layer provided to be separated from the second conductive layer in a second direction intersecting the first direction; and
   a first insulating film provided between the second conductive layer and the first sub-conductive layer,
   one portion of the first conductive layer overlapping at least one portion of the first sub-conductive layer in the first direction,
   one other portion of the first conductive layer overlapping at least one portion of the second conductive layer in the first direction,
   one portion of the first insulating film overlapping at least one portion of the second conductive layer in the second direction, the one portion of the first insulating film overlapping one portion of the first sub-conductive layer in the second direction, the second conductive layer overlapping one other portion of the first insulating film in a direction intersecting the second direction,
   the first sub-conductive layer being insulated from the second conductive layer.

2. The semiconductor memory device according to claim 1, further comprising a first insulating layer provided between the second conductive layer and the first sub-conductive layer, at least one portion of the second conductive layer and at least one portion of the first sub-conductive layer overlapping in the second direction.

3. The semiconductor memory device according to claim 1, further comprising a contact plug extending in the first direction and contacting the first sub-conductive layer and the first conductive layer, the contact plug and the first sub-conductive layer overlapping in a direction intersecting the first direction.

4. The semiconductor memory device according to claim 1, further comprising:
   a semiconductor pillar extending in the first direction; and
   a memory film provided between the first conductive layer and the semiconductor pillar and between the second conductive layer and the semiconductor pillar.

5. The semiconductor memory device according to claim 1, further comprising a second insulating film extending in the first direction,
   the second conductive layer and one portion of the second insulating film overlapping in the second direction, the first sub-conductive layer and the one portion of the second insulating film overlapping in the second direction,
   the second conductive layer and one other portion of the second insulating film overlapping in the second direction and a third direction intersecting the first direction and the second direction,
   the second insulating film and the first conductive layer not overlapping in the third direction, the second insulating film and the first sub-conductive layer not overlapping in the third direction.

6. The semiconductor memory device according to claim 5, wherein
   the first insulating film has a first surface,
   the second insulating film has a second surface,
   at least one portion of the first surface and at least one portion of the second surface overlap in the third direction, and
   a configuration of a portion of the first insulating film having the first surface is an inverted stairstep configuration, and a configuration of a portion of the second insulating film having the second surface is an inverted stairstep configuration.

7. The semiconductor memory device according to claim 5, further comprising:
   a second insulating layer provided between the first conductive layer and the one other portion of the first insulating film; and
   a third insulating layer provided between the first conductive layer and the one other portion of the second insulating film.

8. The semiconductor memory device according to claim 5, wherein a length between the one portion of the first insulating film and the one portion of the second insulating film is longer than a length between the one other portion of the first insulating film and the one other portion of the second insulating film.

9. A semiconductor memory device, comprising:
   a semiconductor pillar extending in a first direction;
   a first conductive layer;
   a first sub-conductive layer arranged with one portion of the first conductive layer in the first direction;
   a second conductive layer provided between the first sub-conductive layer and the semiconductor pillar;
   a memory film provided between the first conductive layer and the semiconductor pillar and between the second conductive layer and the semiconductor pillar;
   a first connecting pillar extending in the first direction, passing through the first sub-conductive layer, and being electrically connected to the first conductive layer; and
   a second connecting pillar extending in the first direction and being electrically connected to the second conductive layer and separated from the first conductive layer.

10. The semiconductor memory device according to claim 9, wherein
    the first conductive layer includes:
      a second conductive layer overlap region, the second conductive layer overlapping the second conductive layer overlap region in the first direction;
      a first sub-conductive layer overlap region, the first sub-conductive layer overlapping the first sub-conductive layer overlap region in the first direction; and
      a first intermediate region, the first intermediate region overlapping a region between the first sub-conductive layer and the second conductive layer in the first direction,
    a length of the first intermediate region along a third direction being shorter than a length of the second conductive layer overlap region along the third direction and shorter than a length of the first sub-conductive layer overlap region along the third direction, the third direction intersecting the first direction and a second direction intersecting the first direction.

11. The semiconductor memory device according to claim 9, further comprising:
    an insulating layer including
      a first insulating film provided between the first sub-conductive layer and the second conductive layer, and
      a region overlapping at least one portion of the first intermediate region in a second direction, the second direction being from the semiconductor pillar toward the first sub-conductive layer.

12. The semiconductor memory device according to claim 11, wherein the first insulating film is positioned between the first connecting pillar and the second connecting pillar.

13. The semiconductor memory device according to claim 9, further comprising a foundation layer,
the first conductive layer being disposed between the foundation layer and the first sub-conductive layer and between the foundation layer and the second conductive layer.

14. The semiconductor memory device according to claim 9, wherein
the first conductive layer includes an end portion on the semiconductor pillar side, and a first conductive layer end portion on a side of the first conductive layer opposite to the end portion on the semiconductor pillar side,
the first sub-conductive layer includes an end portion on the semiconductor pillar side, and a first sub-conductive layer end portion on a side of the first sub-conductive layer opposite to the end portion on the semiconductor pillar side, and
a direction from the first conductive layer end portion toward the first sub-conductive layer end portion is along the first direction.

15. The semiconductor memory device according to claim 9, further comprising:
a third conductive layer;
a first intermediate layer provided between the second conductive layer and the third conductive layer; and
a second sub-conductive layer provided to be separated from the first intermediate layer in the second direction,
one portion of the second conductive layer overlapping at least one portion of the first intermediate layer in the first direction,
one other portion of the second conductive layer overlapping at least one portion of the second sub-conductive layer in the first direction.

16. The semiconductor memory device according to claim 9, further comprising third and fourth conductive layers, a third sub-conductive layer, and third and fourth connecting pillars,
the second conductive layer being disposed between the third conductive layer and the first conductive layer,
the third conductive layer being disposed between the third sub-conductive layer and the second conductive layer and between the fourth conductive layer and the second conductive layer,
the fourth conductive layer being disposed between the third sub-conductive layer and the semiconductor pillar,
the third connecting pillar extending in the first direction, passing through the third sub-conductive layer, and being electrically connected to the third conductive layer,
the fourth connecting pillar extending in the first direction, the fourth connecting pillar being electrically connected to the fourth conductive layer and separated from the third conductive layer.

17. The semiconductor memory device according to claim 16, wherein
the third conductive layer includes an end portion on the semiconductor pillar side, and a third conductive layer end portion on a side of the third conductive layer opposite to the end portion on the semiconductor pillar side,
the third sub-conductive layer includes an end portion on the semiconductor pillar side, and a third sub-conductive layer end portion on a side of the third sub-conductive layer opposite to the end portion on the semiconductor pillar side, and
a direction from the third conductive layer end portion toward the third sub-conductive layer end portion is along the first direction.

18. The semiconductor memory device according to claim 17, wherein
the first conductive layer includes an end portion on the semiconductor pillar side, and a first conductive layer end portion on a side of the first conductive layer opposite to the end portion on the semiconductor pillar side,
the first sub-conductive layer includes an end portion on the semiconductor pillar side, and a first sub-conductive layer end portion on a side of the first sub-conductive layer opposite to the end portion on the semiconductor pillar side,
a direction from the first conductive layer end portion toward the first sub-conductive layer end portion is along the first direction, and
a position along the second direction of the third conductive layer end portion is positioned between the semiconductor pillar and a position along the second direction of the first conductive layer end portion.

19. The semiconductor memory device according to claim 16, further comprising:
an upper conductive layer;
a second intermediate layer provided between the upper conductive layer and the fourth conductive layer; and
a fourth sub-conductive layer provided to be separated from the second intermediate layer in the second direction,
one portion of the fourth conductive layer overlapping at least one portion of the second intermediate layer in the first direction,
one other portion of the fourth conductive layer overlapping at least one portion of the second sub-conductive layer in the first direction.

* * * * *